(12) United States Patent
Hsu et al.

(10) Patent No.: US 11,895,820 B2
(45) Date of Patent: Feb. 6, 2024

(54) METHOD OF MANUFACTURING MEMORY DEVICE HAVING WORD LINE WITH IMPROVED ADHESION BETWEEN WORK FUNCTION MEMBER AND CONDUCTIVE LAYER

(71) Applicant: NANYA TECHNOLOGY CORPORATION, New Taipei (TW)

(72) Inventors: Yueh Hsu, New Taipei (TW); Wei-Tong Chen, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 113 days.

(21) Appl. No.: 17/578,918

(22) Filed: Jan. 19, 2022

(65) Prior Publication Data
US 2023/0232609 A1    Jul. 20, 2023

(51) Int. Cl.
*H10B 12/00* (2023.01)

(52) U.S. Cl.
CPC .......... *H10B 12/053* (2023.02); *H10B 12/34* (2023.02)

(58) Field of Classification Search
None
See application file for complete search history.

(56) References Cited

U.S. PATENT DOCUMENTS

| 9,754,943 B1 | 9/2017 | Chang et al. |
| 10,546,863 B1 | 1/2020 | Kobayashi |
| 11,075,272 B2 | 7/2021 | Kim |
| 11,183,579 B2 | 11/2021 | Kim |
| 11,380,761 B2 | 7/2022 | Ry |
| 11,600,710 B2 | 3/2023 | Kim |

(Continued)

FOREIGN PATENT DOCUMENTS

| TW | 201935660 A | 9/2019 |
| TW | 202143391 A | 11/2021 |

OTHER PUBLICATIONS

Taiwanese Office Action dated Jun. 6, 2023 in application No. 111120464, the search report attached to the Office Action; pp. 1-8.

(Continued)

*Primary Examiner* — Hsien Ming Lee
(74) *Attorney, Agent, or Firm* — Muncy, Geissler, Olds & Lowe, P.C.

(57) ABSTRACT

The present application provides a method of manufacturing a memory device having a word line (WL) with improved adhesion between a work function member and a conductive layer. The method includes steps of providing a semiconductor substrate defined with an active area and including an isolation structure surrounding the active area; forming a recess extending into the semiconductor substrate and across the active area; forming a first insulating layer conformal to the recess; disposing a first conductive material conformal to the first insulating layer; forming a conductive member surrounded by the first conductive material; disposing a second conductive material over the conductive member and removing a portion of the first conductive material above the second conductive material to form a conductive layer enclosing the conductive member; and forming a second insulating layer over the conductive layer and conformal to the first insulating layer.

6 Claims, 37 Drawing Sheets

(56) References Cited

U.S. PATENT DOCUMENTS

| | | | |
|---|---|---|---|
| 2014/0159145 A1* | 6/2014 | Park | H10B 12/053 257/330 |
| 2015/0214314 A1* | 7/2015 | Oh | H01L 29/785 257/330 |
| 2016/0093717 A1 | 3/2016 | Oh | |
| 2016/0336414 A1 | 11/2016 | Kang | |
| 2017/0047421 A1 | 2/2017 | Oh et al. | |
| 2017/0186753 A1 | 6/2017 | Kang et al. | |
| 2019/0115351 A1 | 4/2019 | Jeon et al. | |
| 2021/0327882 A1 | 10/2021 | Liao | |
| 2022/0328491 A1 | 10/2022 | Chang | |

OTHER PUBLICATIONS

Taiwanese Office Action dated Jun. 22, 2023 in application No. 111120465, the search report attached to the Office Action; pp. 1-5.
U.S. Office Action dated Jun. 22, 2023 in U.S. Appl. No. 17/578,666, the search report attached to the Office Action; pp. 1-22.

* cited by examiner

METHOD OF MANUFACTURING MEMORY DEVICE HAVING WORD LINE WITH IMPROVED ADHESION BETWEEN WORK FUNCTION MEMBER AND CONDUCTIVE LAYER

TECHNICAL FIELD

The present disclosure relates to a method of manufacturing a memory device, and more particularly, to a method of manufacturing a memory device having a word line (WL) with improved adhesion between a work function member and a conductive layer.

DISCUSSION OF THE BACKGROUND

Dynamic random-access memory (DRAM) is a type of semiconductor arrangement for storing bits of data in separate capacitors within an integrated circuit (IC). DRAMs are commonly formed as trench capacitor DRAM cells. An advanced method of fabricating a buried gate electrode involves building a gate electrode of a transistor and a word line in a trench in an active area (AA) comprising a shallow trench isolation (STI) structure.

Over the past few decades, as semiconductor fabrication technology has continuously improved, sizes of electronic devices have been correspondingly reduced. As a size of a cell transistor is reduced to a few nanometers in length, shrinkage may occur during thermal processes. The shrinkage may result in diminished adhesion between components of different materials and thus a significant drop in performance of the cell transistors. It is therefore desirable to develop improvements that address related manufacturing challenges.

SUMMARY

One aspect of the present disclosure provides a memory device. The memory device includes a semiconductor substrate defined with an active area and including a recess extending into the semiconductor substrate; and a word line disposed within the recess, wherein the word line includes a first insulating layer disposed within and conformal to the recess, a conductive layer surrounded by the first insulating layer, a conductive member enclosed by the conductive layer, and a second insulating layer disposed over the conductive layer and conformal to the first insulating layer.

In some embodiments, the second insulating layer is in contact with the conductive layer.

In some embodiments, the second insulating layer is disposed above the conductive member and the conductive layer.

In some embodiments, the first insulating layer and the second insulating layer include oxide.

In some embodiments, a thickness of the first insulating layer is substantially greater than or equal to a thickness of the second insulating layer.

In some embodiments, the second insulating layer is in contact with a top surface of the conductive layer.

In some embodiments, the second insulating layer is at least partially surrounded by the active area.

In some embodiments, the conductive layer includes titanium nitride (TiN).

In some embodiments, the conductive member includes tungsten (W).

In some embodiments, the word line includes a work function member surrounded by the second insulating layer, and a gate insulating member disposed over the work function member.

In some embodiments, a top surface of the work function member is substantially coplanar with a top surface of the second insulating layer.

In some embodiments, the gate insulating member is disposed over the second insulating layer.

In some embodiments, the gate insulating member is in contact with the second insulating layer and the work function member.

In some embodiments, the work function member and the gate insulating member are surrounded by the first insulating layer.

In some embodiments, a width of the gate insulating member is substantially greater than or equal to a total width of the second insulating layer and the work function member.

In some embodiments, the work function member includes polysilicon, and the gate insulating member includes nitride.

Another aspect of the present disclosure provides a memory device. The memory device includes a semiconductor substrate defined with an active area and including a recess extending into the semiconductor substrate; and a word line disposed within the recess, wherein the word line includes a first insulating layer disposed within and conformal to the recess, a conductive layer surrounded by the first insulating layer, a conductive member enclosed by the conductive layer, a second insulating layer disposed over the conductive layer and conformal to the first insulating layer, a work function member surrounded by the second insulating layer, and a third insulating layer surrounded by the second insulating layer and disposed over the work function member.

In some embodiments, the work function member is enclosed by the second insulating layer and the third insulating layer.

In some embodiments, the third insulating layer is disposed conformal to a top surface of the work function member.

In some embodiments, a thickness of the second insulating layer is substantially equal to a thickness of the third insulating layer.

In some embodiments, the second insulating layer and the third insulating layer are integrally formed.

In some embodiments, the second insulating layer and the third insulating layer include oxide.

In some embodiments, the second insulating layer and the third insulating layer include a same material.

In some embodiments, the first insulating layer is entirely covered by the conductive layer and the second insulating layer, In some embodiments, the word line includes a gate insulating member surrounded by the second insulating layer and disposed over the third insulating layer and the work function member.

Another aspect of the present disclosure provides a method of manufacturing a memory device. The method includes steps of providing a semiconductor substrate defined with an active area and including an isolation structure surrounding the active area; forming a recess extending into the semiconductor substrate and across the active area; forming a first insulating layer conformal to the recess; disposing a first conductive material conformal to the first insulating layer; limning a conductive member surrounded by the first conductive material; disposing a second conductive material over the conductive member and removing a portion of the first conductive material above the second conductive material to form a conductive layer enclosing the conductive member; and forming a second insulating layer over the conductive layer and conformal to the first insulating layer.

In some embodiments, the formation of the second insulating layer is performed after the formation of the conductive layer and the formation of the conductive member.

In some embodiments, the formation of the second insulating layer includes disposing an insulating material by atomic layer deposition (ALD).

In some embodiments, the formation of the second insulating layer includes removing a portion of the insulating material by anisotropic etching.

In some embodiments, a top surface of the second insulating layer is substantially lower than a top surface of the first insulating layer and a top surface of the semiconductor substrate.

In some embodiments, a top surface of the second insulating layer is substantially coplanar with a top surface of the first insulating layer and a top surface of the semiconductor substrate.

In some embodiments, the method further includes forming a work function member over the conductive layer, wherein the work function member is surrounded by the second insulating layer.

In some embodiments, a top surface of the work function member is substantially coplanar with a top surface of the second insulating layer.

In some embodiments, a top surface of the work function member is substantially lower than a top surface of the second insulating layer.

In some embodiments, the method further includes forming a third insulating layer over the work function member, wherein the third insulating layer is surrounded by the second insulating layer.

In conclusion, because an insulating layer is disposed between a work function member and a conductive layer in a word line, an adhesion between the work function member and the conductive layer is increased or improved. Therefore, shrinkage or disappearance of the work function member after a thermal process can be prevented. An overall performance of the memory device and process of manufacturing the memory device are improved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set firth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
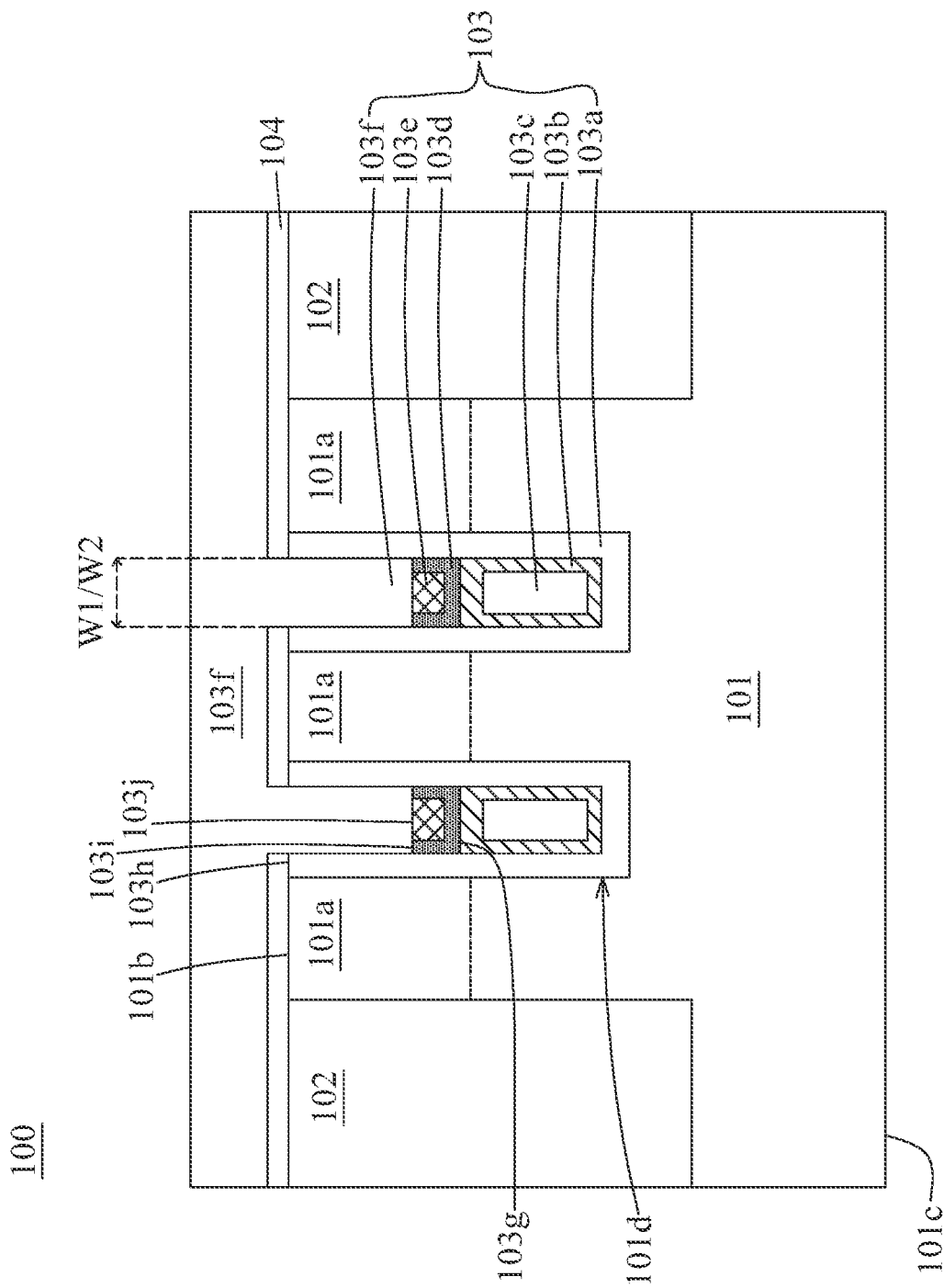
FIG. 1 is a cross-sectional side view of a memory device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a schematic cross-sectional side view of a memory device 100 in accordance with some embodiments of the present disclosure. In some embodiments, the memory device 100 includes several unit cells arranged in rows and columns.

In some embodiments, the memory device 100 includes a semiconductor substrate 101. In some embodiments, the semiconductor substrate 101 includes semiconductive material such as silicon, germanium, gallium, arsenic, or a combination thereof. In some embodiments, the semiconductor substrate 101 includes bulk semiconductor material.

In some embodiments, the semiconductor substrate 101 is a semiconductor wafer (e.g., a silicon wafer) or a semiconductor-on-insulator (SOI) wafer (e.g., a silicon-on-insulator wafer). In some embodiments, the semiconductor substrate 101 is a silicon substrate. In some embodiments, the semiconductor substrate 101 includes lightly-doped monocrystalline silicon. In some embodiments, the semiconductor substrate 101 is a p-type substrate.

In some embodiments, the semiconductor substrate 101 includes several active areas (AA) 101a. The active area 101a is a doped region in the semiconductor substrate 101. In some embodiments, the active area 101a extends horizontally over or under a top surface 101b of the semiconductor substrate 101. In some embodiments, each of the active areas 101a includes a same type of dopant. In some embodiments, each of the active areas 101a includes a type of dopant that is different from the types of dopants included in other active areas 101a. In some embodiments, each of the active areas 101a has a same conductive type. In some embodiments, the active area 101a includes N-type dopants.

In some embodiments, the semiconductor substrate 101 includes the top surface 101b and a bottom surface 101c opposite to the top surface 101b. In some embodiments, the top surface 101b is a front side of the semiconductor substrate 101, wherein electrical devices or components are subsequently formed over the top surface 101b and configured to electrically connect to an external circuitry. In some embodiments, the bottom surface 101c is a back side of the semiconductor substrate 101, where electrical devices or components are absent.

In some embodiments, the semiconductor substrate 101 includes a recess 101d extending into the semiconductor substrate 101. In some embodiments, the recess 101d extends from the top surface 101b toward the bottom surface 101c of the semiconductor substrate 101. In some embodiments, the recess 101d is tapered from the top surface 101b toward the bottom surface 101c of the semiconductor substrate 101. In some embodiments, a depth of the recess 101d is substantially greater than a depth of the active area 101a.

In some embodiments, the memory device 100 includes a word line 103 disposed within the recess 101d. In some embodiments, the word line 103 includes a first insulating layer 103a, a conductive layer 103b, a conductive member 103c and a second insulating layer 103d. In some embodiments, the first insulating layer 103a is disposed conformal to and within the recess 101d. In some embodiments, the conductive layer 103b is surrounded by the first insulating layer 103a. In some embodiments, the conductive member 103c is enclosed by the conductive layer 103b. In some embodiments, the second insulating layer 103d is disposed over the conductive layer 103b and conformal to the first insulating layer 103a.

In some embodiments, the first insulating layer 103a is disposed along an entire sidewall of the recess 101d. In some embodiments, the first insulating layer 103a includes dielectric material such as oxide. In some embodiments, the first insulating layer 103a is formed of an insulating material, such as silicon oxide, silicon nitride, silicon oxynitride, the like, or a combination thereof. In some embodiments, the first insulating layer 103a includes dielectric material with a low dielectric constant (low k).

In some embodiments, the conductive layer 103b is disposed within the recess 101d, wherein the conductive layer 103b is surrounded by the first insulating layer 103a. The conductive layer 103b is conformal to a portion of the first insulating layer 103a. In some embodiments, the conductive layer 103b includes conductive material such as titanium nitride (TiN).

In some embodiments, the conductive member 103c is disposed within the conductive layer 103b. The conductive member 103c is surrounded by the first insulating layer 103a and the conductive layer 103b. In some embodiments, the conductive member 103c is disposed under the active area 101a of the semiconductor substrate 101. In some embodiments, a portion of the conductive layer 103b is disposed above the conductive member 103c. In some embodiments, the conductive member 103c includes conductive material such as tungsten (W).

In some embodiments, the second insulating layer 103d is disposed over the conductive layer 103b, wherein the second insulating layer 103d is surrounded by the first insulating layer 103a. The second insulating layer 103d is disposed above the conductive member 103c and the conductive layer 103b. In some embodiments, the second insulating layer 103d is in contact with the conductive layer 103b. In some embodiments, the second insulating layer 103d is conformal to a portion of the first insulating layer 103a.

In some embodiments, the second insulating layer 103d is in contact with a top surface 103g of the conductive layer 103b. In some embodiments, the second insulating layer 103d is at least partially surrounded by the active area 101a. In some embodiments, a top surface 103i of the second insulating layer 103d is substantially lower than the top surface 101b of the semiconductor substrate 101 and a top surface 103h of the first insulating layer 103a.

In some embodiments, the second insulating layer 103d includes dielectric material such as oxide. In some embodiments, the second insulating layer 103d is formed of an insulating material, such as silicon oxide, silicon nitride, silicon oxynitride, the like, or a combination thereof. In some embodiments, the first insulating layer 103a and the second insulating layer 103d include a same material or different materials. In some embodiments, a thickness of the first insulating layer 103a is substantially greater than or equal to a thickness of the second insulating layer 103d. In some embodiments, the thickness of the second insulating layer 103d is in a range of about 1 nm to about 3 nm. In some embodiments, the thickness of the second insulating layer 103d is about 1.5 nm.

In some embodiments, the word line 103 further includes a work function member 103e disposed over the conductive layer 103b and the conductive member 103c, and a gate insulating member 103f disposed over the work function member 103e. In some embodiments, the work function member 103e and the gate insulating member 103f are surrounded by the first insulating layer 103a. In some embodiments, the work function member 103e is surrounded by the second insulating layer 103d.

In some embodiments, a top surface 103j of the work function member 103e is substantially coplanar with the top surface 103i of the second insulating layer 103d. In some embodiments, the work function member 103e includes polysilicon or polycrystalline silicon. In some embodiments, the work function member 103e has a low work function. In some embodiments, the work function member 103e has dual work functions and includes metal and polysilicon. In some embodiments, the work function member 103e serves as a gate electrode.

In some embodiments, the gate insulating member 103f is disposed over the second insulating layer 103d and the work function member 103e. In some embodiments, the gate insulating member 103f is in contact with the second insulating layer 103d and the work function member 103e. In some embodiments, the gate insulating member 103f contacts the top surface 103j of the work function member 103e and the top surface 103i of the second insulating layer 103d. In some embodiments, the work function member 103e and the gate insulating member 103f are surrounded by the first insulating layer 103a. In some embodiments, the gate insulating member 103f is disposed over the top surface 101b of the semiconductor substrate 101.

In some embodiments, a width W1 of the gate insulating member 103f is substantially greater than or equal to a total width W2 of the second insulating layer 103d and the work function member 103e. In some embodiments, the total width W2 is a sum of two times a thickness of the second insulating layer 103d plus a width of the work function member 103e. In some embodiments, the gate insulating member 103f includes dielectric material such as nitride. In some embodiments, the gate insulating member 103f serves as a gate dielectric.

In some embodiments, the memory device 100 further includes an isolation structure 102 adjacent to the word line 103. In some embodiments, the isolation structure 102 extends into the semiconductor substrate 101 from the top surface 101b toward the bottom surface 101c. In some embodiments, the isolation structure 102 is a shallow trench isolation (STI). In some embodiments, the isolation structure 102 defines a boundary of the active area 101a. In some embodiments, the isolation structure 102 is formed of an insulating material, such as silicon oxide, silicon nitride, silicon oxynitride, the like, or a combination thereof. In some embodiments, a depth of the isolation structure 102 is substantially greater than a depth of the word line 103.

In some embodiments, the memory device 100 further includes a mask layer 104 disposed over the top surface 101b of the semiconductor substrate 101 and the isolation structure 102. In some embodiments, the mask layer 104 is disposed over the first insulating layer 103a. In some embodiments, the mask layer 104 is in contact with the top surface 103h of the first insulating layer 103a. In some embodiments, the mask layer 104 is disposed between the gate insulating member 103f and the semiconductor substrate 101 and between the gate insulating member 103f and the isolation structure 102. In some embodiments, the mask layer 104 includes dielectric material such as nitride or the like.

Because the second insulating layer 103d is disposed between the work function member 103e and the conductive layer 103b, an adhesion between the work function member 103e and the conductive layer 103b is increased or improved. Therefore, shrinkage or disappearance of the work function member 103e after a thermal process can be prevented. Overall performance of the memory device 100 can be improved.

Figure 2:
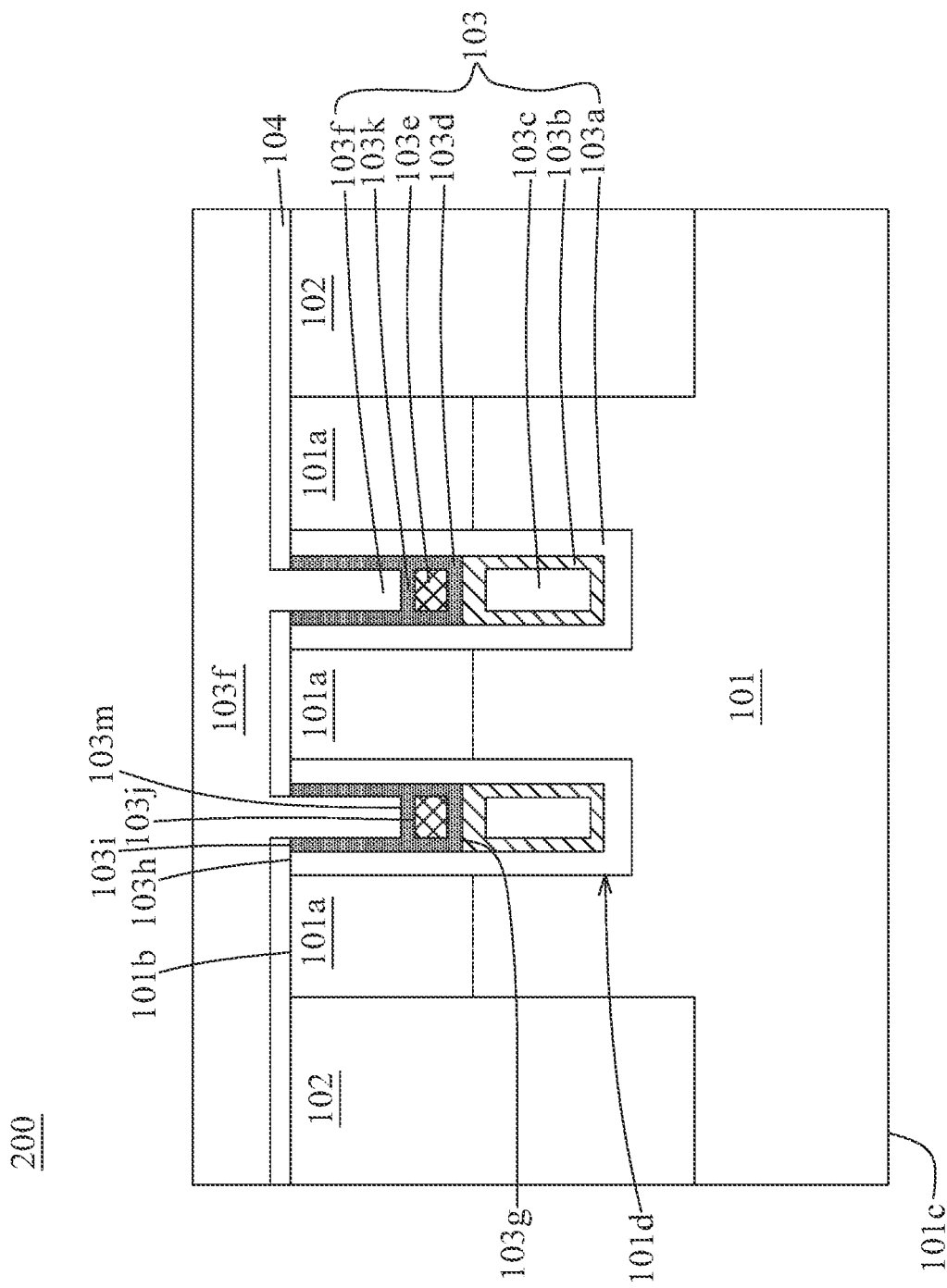
FIG. 2 is a cross-sectional side view of a memory device in accordance with other embodiments of the present disclosure.

FIG. 2 is a schematic cross-sectional side view of a memory device 200 in accordance with some embodiments of the present disclosure. The memory device 200 is similar to the memory device 100 of FIG. 1, except there is a third insulating layer 103k over the work function member 103e such that the work function member 103e is enclosed by the second insulating layer 103d and the third insulating layer 103k. In some embodiments, the first insulating layer 103a is entirely covered by the conductive layer 103b and the second insulating layer 103d. In some embodiments, the gate insulating member 103f is surrounded by the second insulating layer 103d and disposed over the third insulating layer 103k and the work function member 103e.

In some embodiments, the third insulating layer 103k is surrounded by the second insulating layer 103d. In some embodiments, the third insulating layer 103k is disposed conformal to the top surface 103j of the work function member 103e. In some embodiments, a top surface 103m of the third insulating layer 103k is substantially lower than the top surface 103i of the second insulating layer 103d, the top surface 103h of the first insulating layer 103a and the top surface 101b of the semiconductor substrate 101.

In some embodiments, a thickness of the second insulating layer 103d is substantially equal to a thickness of the third insulating layer 103k. In some embodiments, the second insulating layer 103d and the third insulating layer 103k are integrally formed. In some embodiments the third insulating layer 103k includes oxide. In some embodiments, the second insulating layer 103d and the third insulating layer 103k include a same material.

Figure 3:
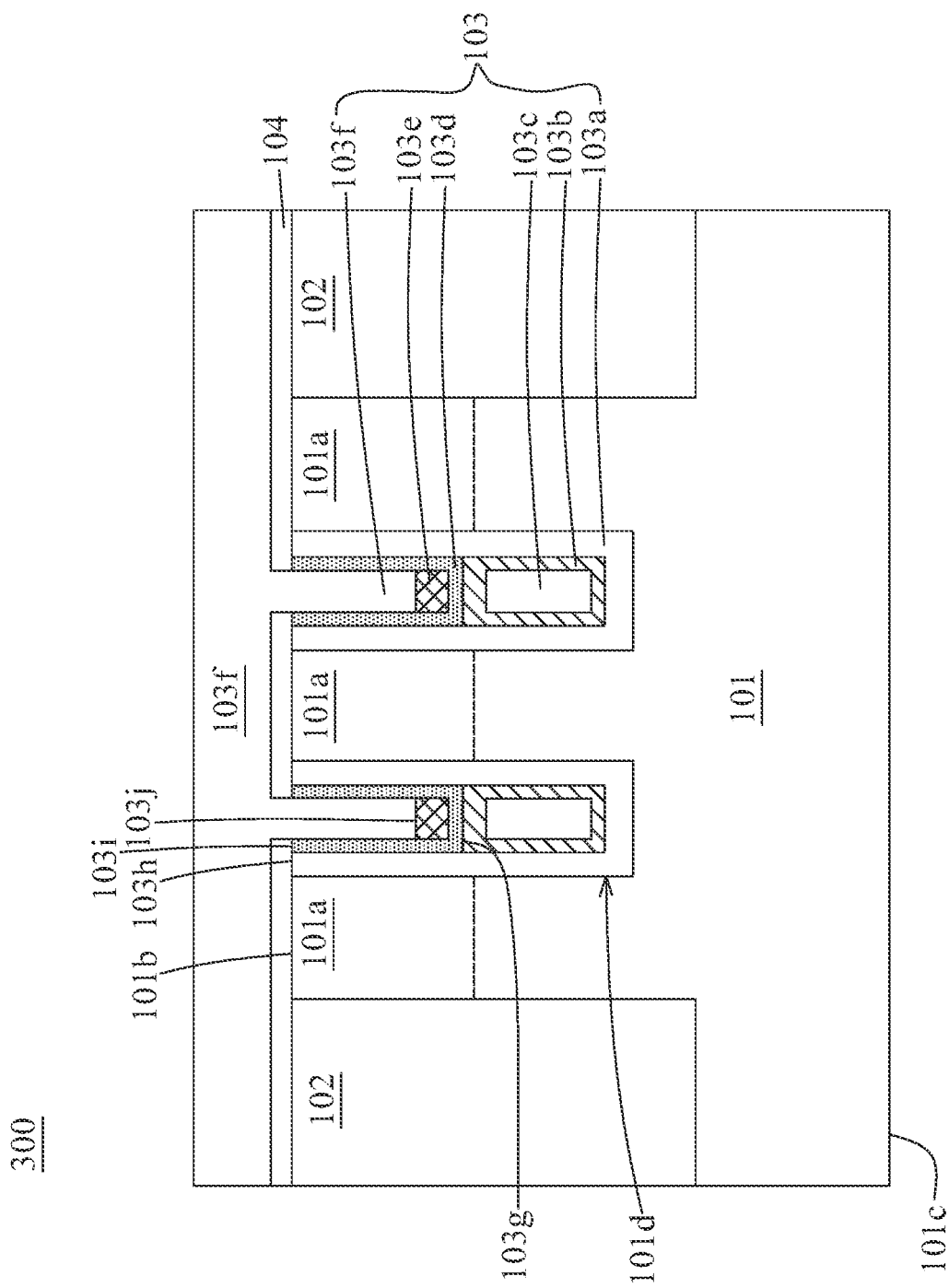
FIG. 3 is a cross-sectional side view of a memory device in accordance with other embodiments of the present disclosure.

FIG. 3 is a schematic cross-sectional side view of a memory device 300 in accordance with some embodiments of the present disclosure. The memory device 300 is similar to the memory device 200 of FIG. 2, except the third insulating layer 103k in the memory device 200 of FIG. 2 is omitted. In some embodiments, the gate insulating member 103f is in contact with the work function member 103e. The second insulating layer 103d surrounds the work function member 103e and the gate insulating member 103f.

Figure 4:
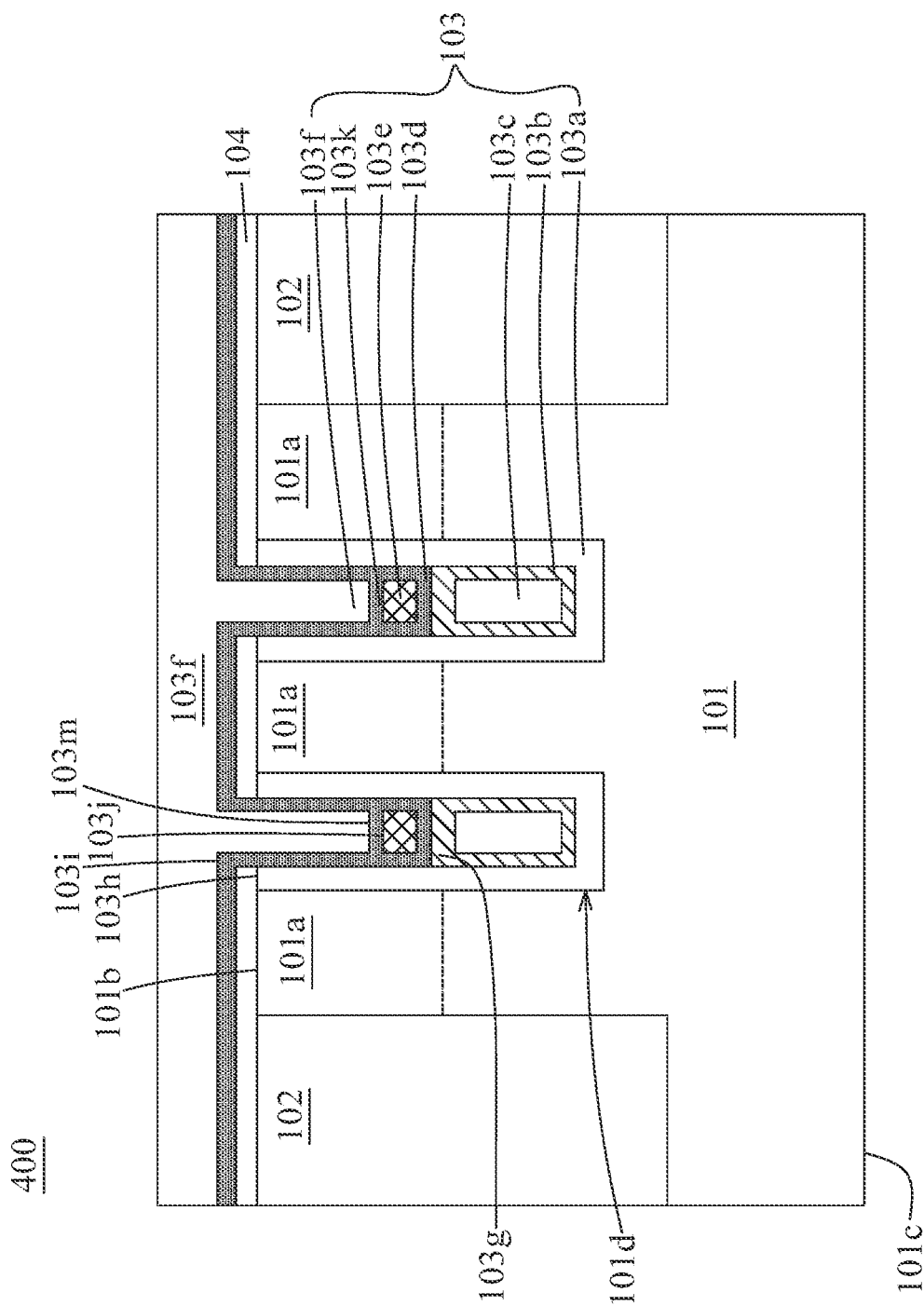
FIG. 4 is a cross-sectional side view of a memory device in accordance with other embodiments of the present disclosure.

FIG. 4 is a schematic cross-sectional side view of a memory device 400 in accordance with some embodiments of the present disclosure. The memory device 400 is similar to the memory device 200 of FIG. 2, except the second insulating layer 103d is also disposed over the top surface 101b of the semiconductor substrate 101 and the isolation structure 102. In some embodiments, the second insulating layer 103d is disposed over the mask layer 104. In some embodiments, the top surface 103i of the second insulating layer 103d is above the top surface 103h of the first insulating layer 103a and the top surface 101b of the semiconductor substrate 101.

Figure 5:
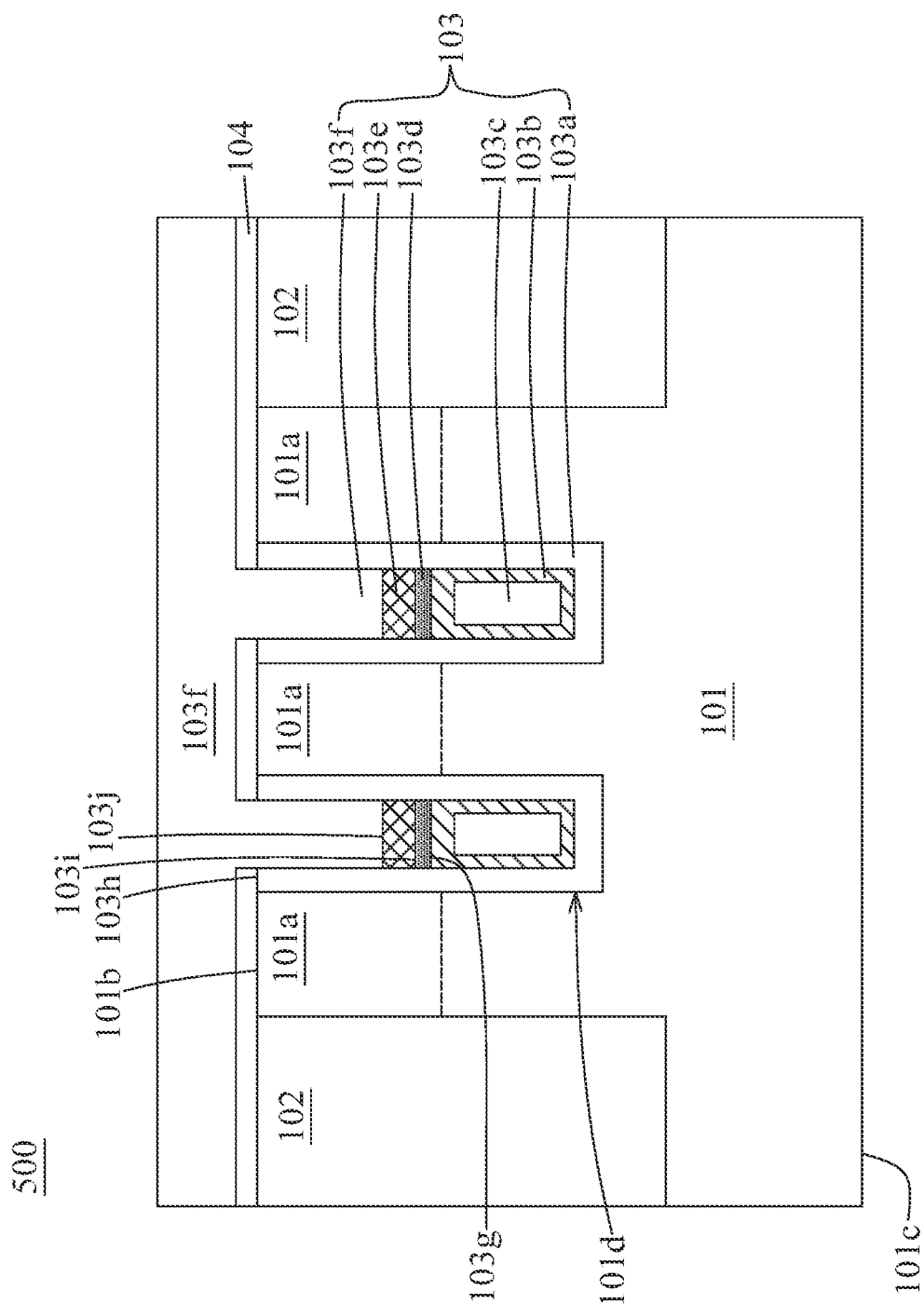
FIG. 5 is a cross-sectional side view of a memory device in accordance with other embodiments of the present disclosure.

FIG. 5 is a schematic cross-sectional side view of a memory device 500 in accordance with some embodiments of the present disclosure. The memory device 500 is similar to the memory device 100 of FIG. 1, except the second insulating layer 103d is disposed under the work function member 103e. The second insulating layer 103d is between the work function member 103e and the conductive layer 103b. In some embodiments, the second insulating layer 103d is enclosed by the work function member 103e, the conductive layer 103h and the first insulating layer 103a. In some embodiments, the top surface 103i of the second insulating layer 103d is entirely in contact with the work function member 103e. In some embodiments, the top surface 103i is substantially lower than the top surface 103j of the work function member 103e.

Figure 6:
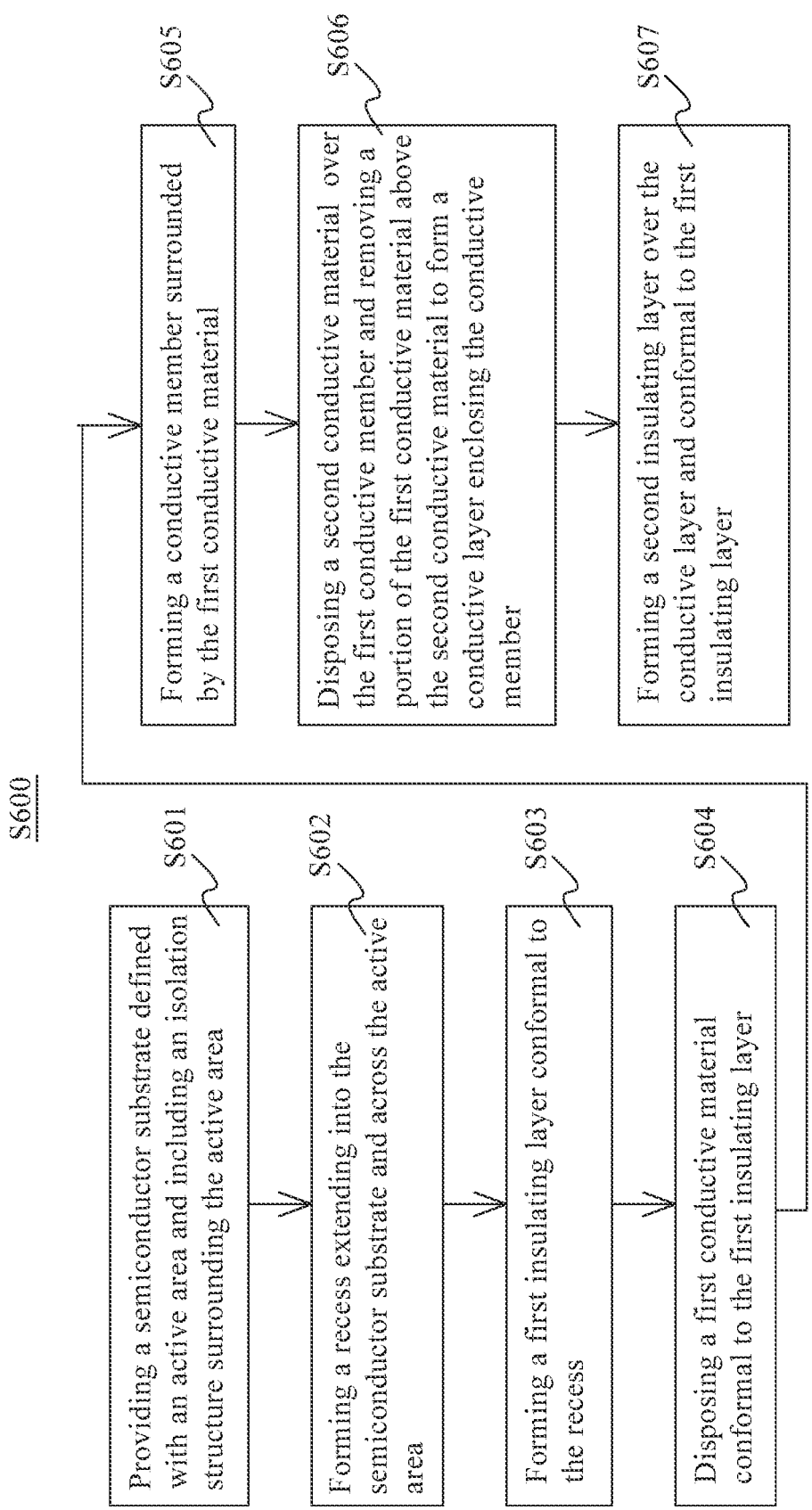
FIG. 6 is a flow diagram illustrating a method of manufacturing a memory device in accordance with some embodiments of the present disclosure.

FIG. 6 is a flow diagram illustrating a method S600 of manufacturing the memory device 100, 200, 300, 400 or 500 in accordance with some embodiments of the present disclosure, and FIGS. 7 to 37 illustrate cross-sectional views of intermediate stages in formation of the memory device 100, 200, 300, 400 or 500 in accordance with some embodiments of the present disclosure.

The stages shown in FIGS. 7 to 37 are also illustrated schematically in the flow diagram in FIG. 6. In following discussion, the fabrication stages shown in FIGS. 7 to 37 are discussed in reference to process steps shown in FIG. 6. The method S600 includes a number of operations, and description and illustration are not deemed as a limitation to a sequence of the operations. The method S600 includes a number of steps (S601, S602, S603, S604, S605, S606 and S607).

Figure 7:
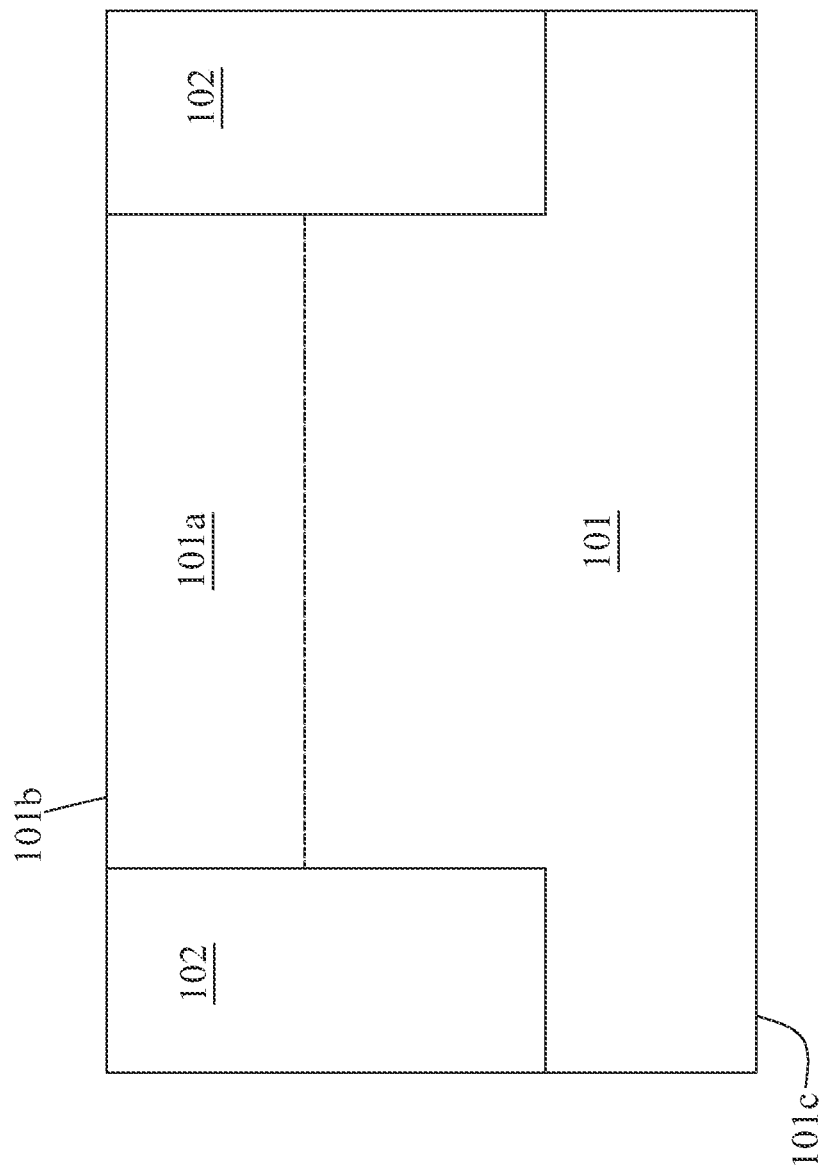
FIGS. 7 to 37 illustrate cross-sectional views of intermediate stages in the formation of a memory device in accordance with some embodiments of the present disclosure.

Referring to FIG. 7, a semiconductor substrate 101 is provided according to step S601 in FIG. 6. In some embodiments, the semiconductor substrate 101 is defined with an active area 101a and includes an isolation structure 102 surrounding the active area 101a. In some embodiments, the isolation structure 102 extends from a top surface 101b toward a bottom surface 101c of the semiconductor substrate 101.

Figure 8:
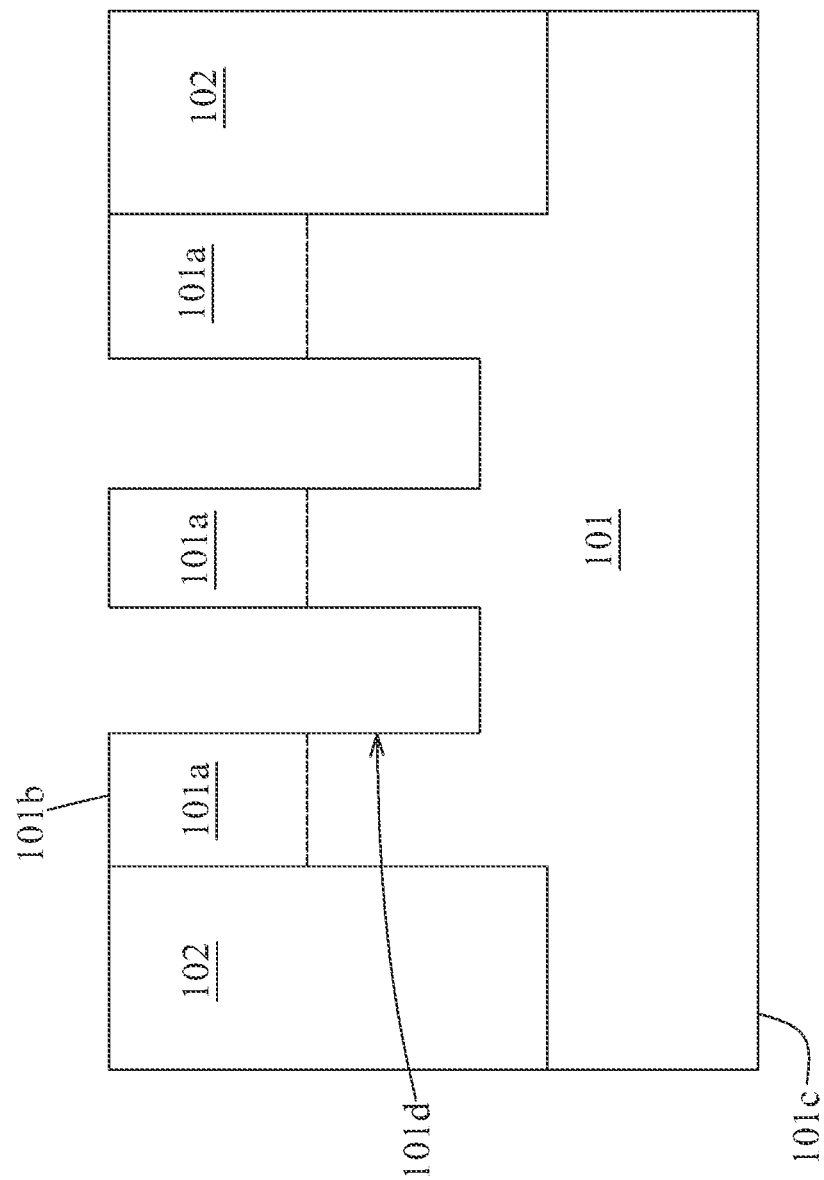

Referring to FIG. 8, a recess 101d extending into the semiconductor substrate 101 is formed according to step S602 in FIG. 6. In some embodiments, the recess 101d extends across the active area 101a. In some embodiments, the formation of the recess 101d includes removing some portions of the semiconductor substrate 101. In some embodiments, the recess 101d extends from the top surface 101b toward the bottom surface 101c of the semiconductor substrate 101.

Figure 9:
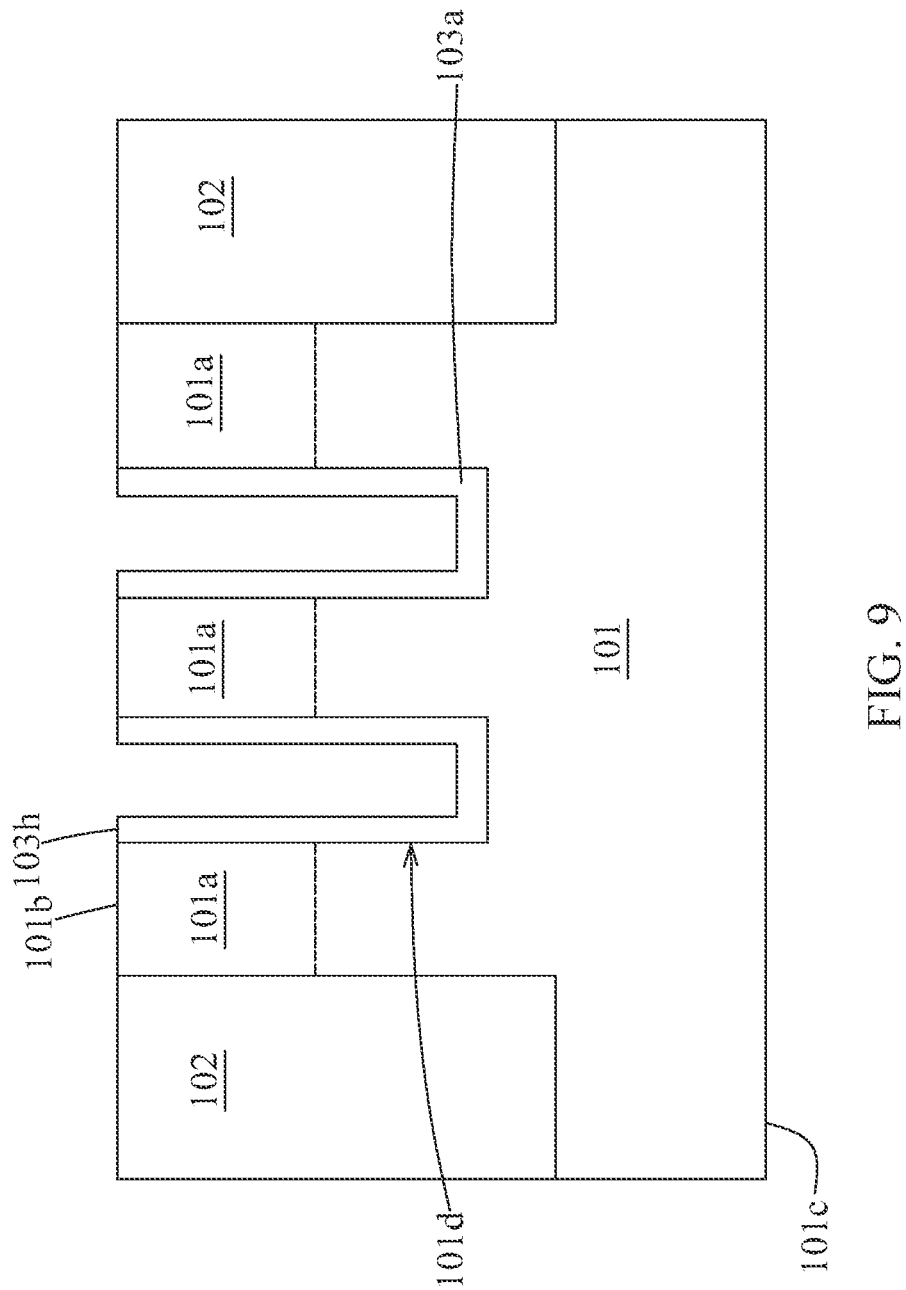

Referring to FIG. 9, a first insulating layer 103a conformal to the recess 101d is formed according to step S603 in FIG. 6. In some embodiments, the first insulating layer 103a is formed by deposition, oxidation or any other suitable process. In some embodiments, a top surface 103h of the first insulating layer 103a is substantially coplanar with the top surface 101b of the semiconductor substrate 101.

Figure 10:
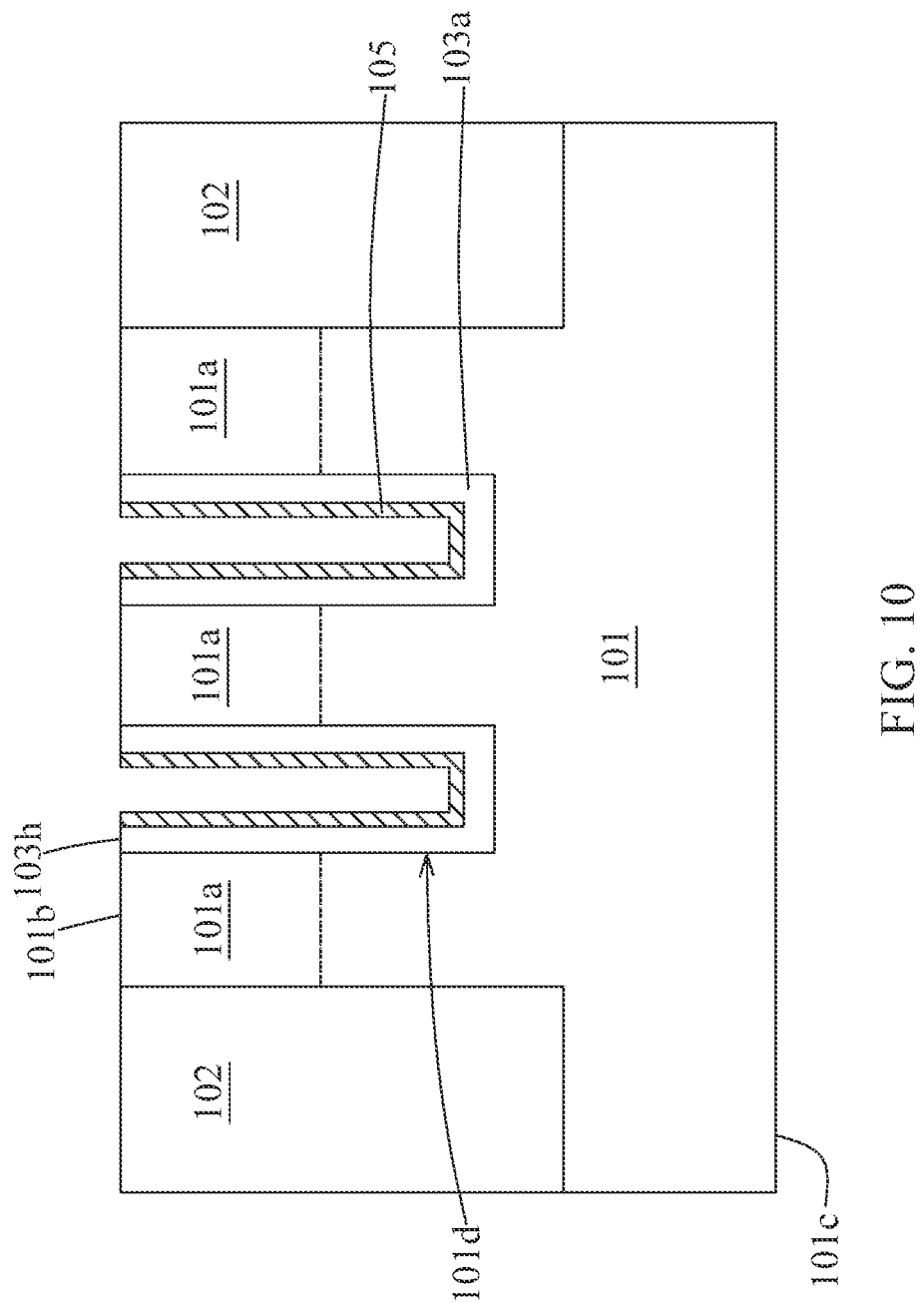

Referring to FIG. 10, a first conductive material 105 conformal to the first insulating layer 103a is disposed according to step S604 in FIG. 6. In some embodiments, the first conductive material 105 is disposed by deposition or any other suitable process. In some embodiments, the first conductive material 105 includes titanium nitride (TiN).

Figure 11:
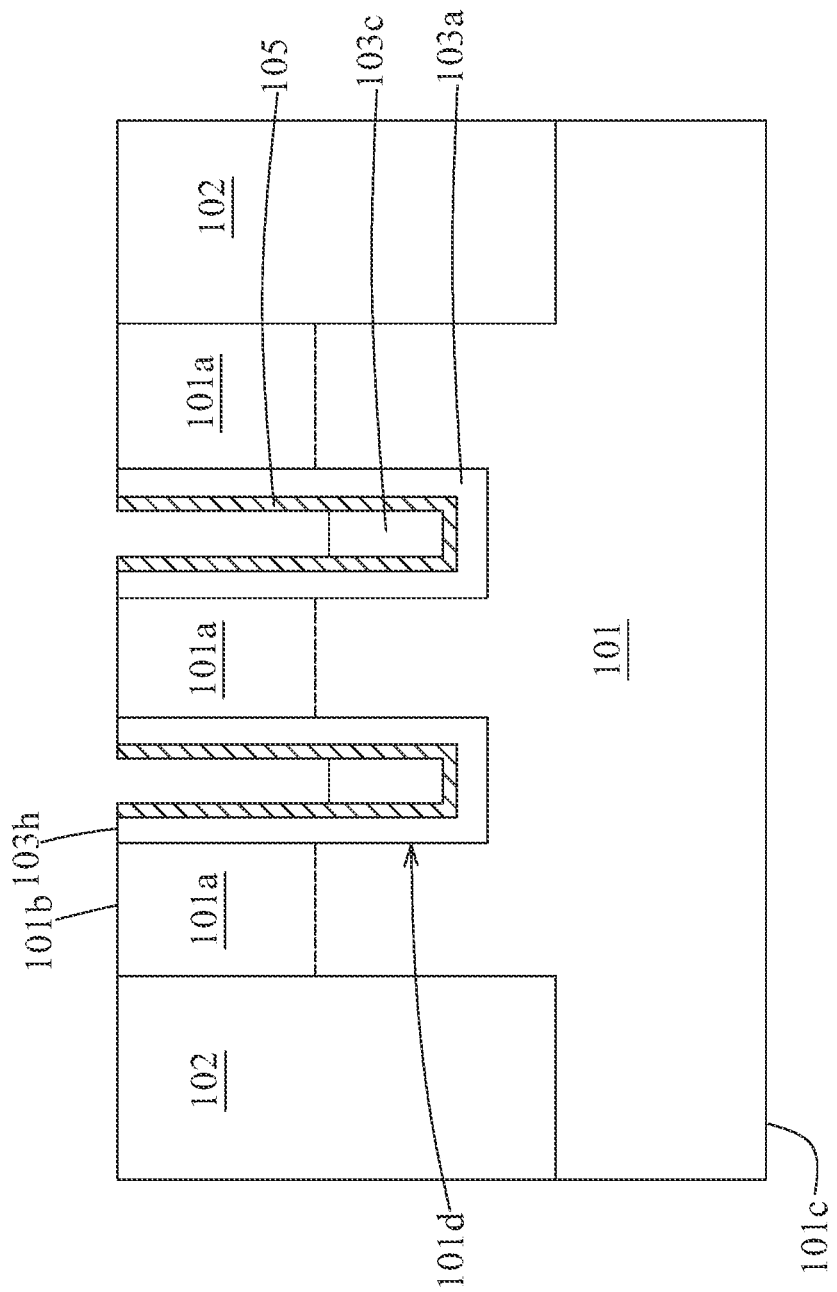

Referring to FIG. 11, a conductive member 103c surrounded by the first conductive material 105 is formed according to step S605 in FIG. 6. In some embodiments, the conductive member 103c is formed by disposing a second conductive material surrounded by the first conductive material 105, and then removing a portion of the second conductive material to form the conductive member 103c. In some embodiments, the second conductive material is disposed by deposition or any other suitable process. In some embodiments, the portion of the second conductive material is removed by etching or any other suitable process. In some embodiments, the second conductive material includes tungsten (W).

Figure 12:
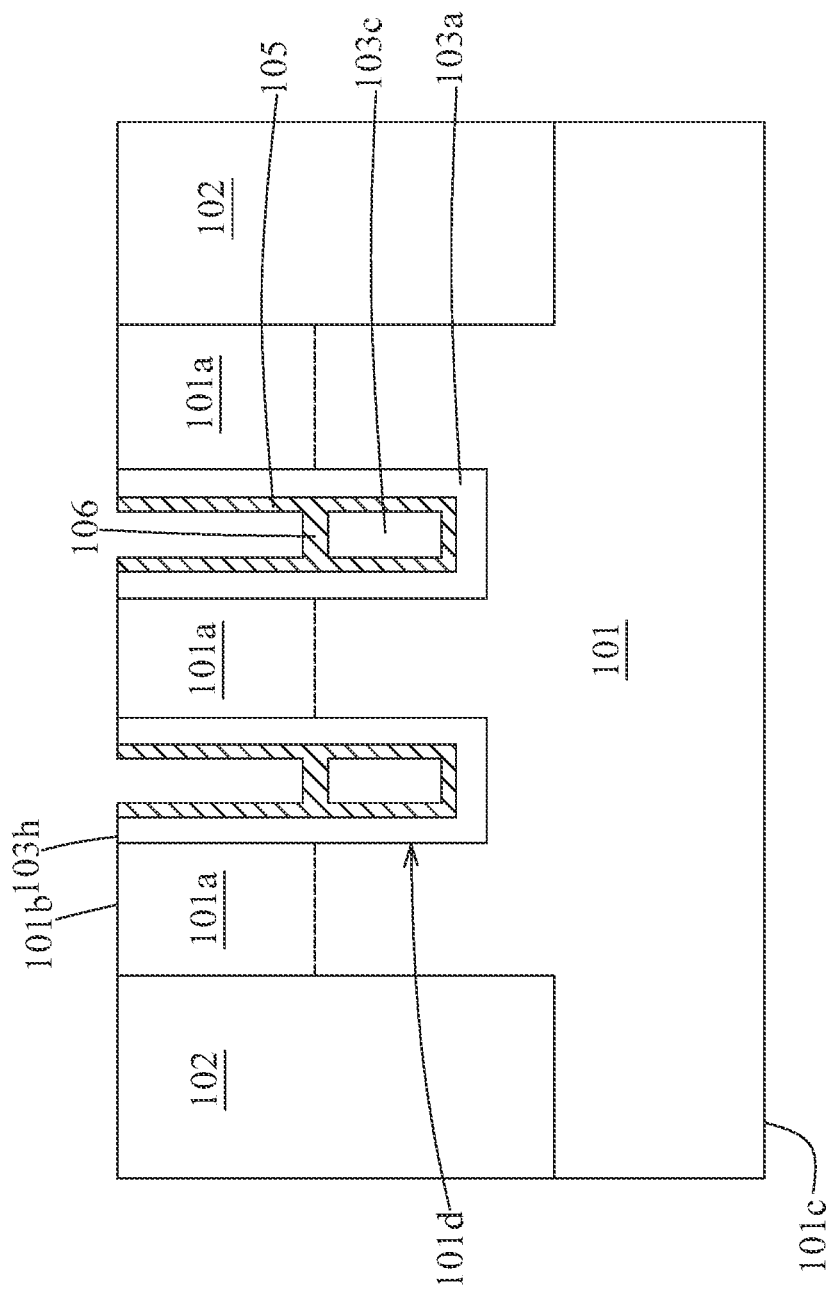
Figure 13:
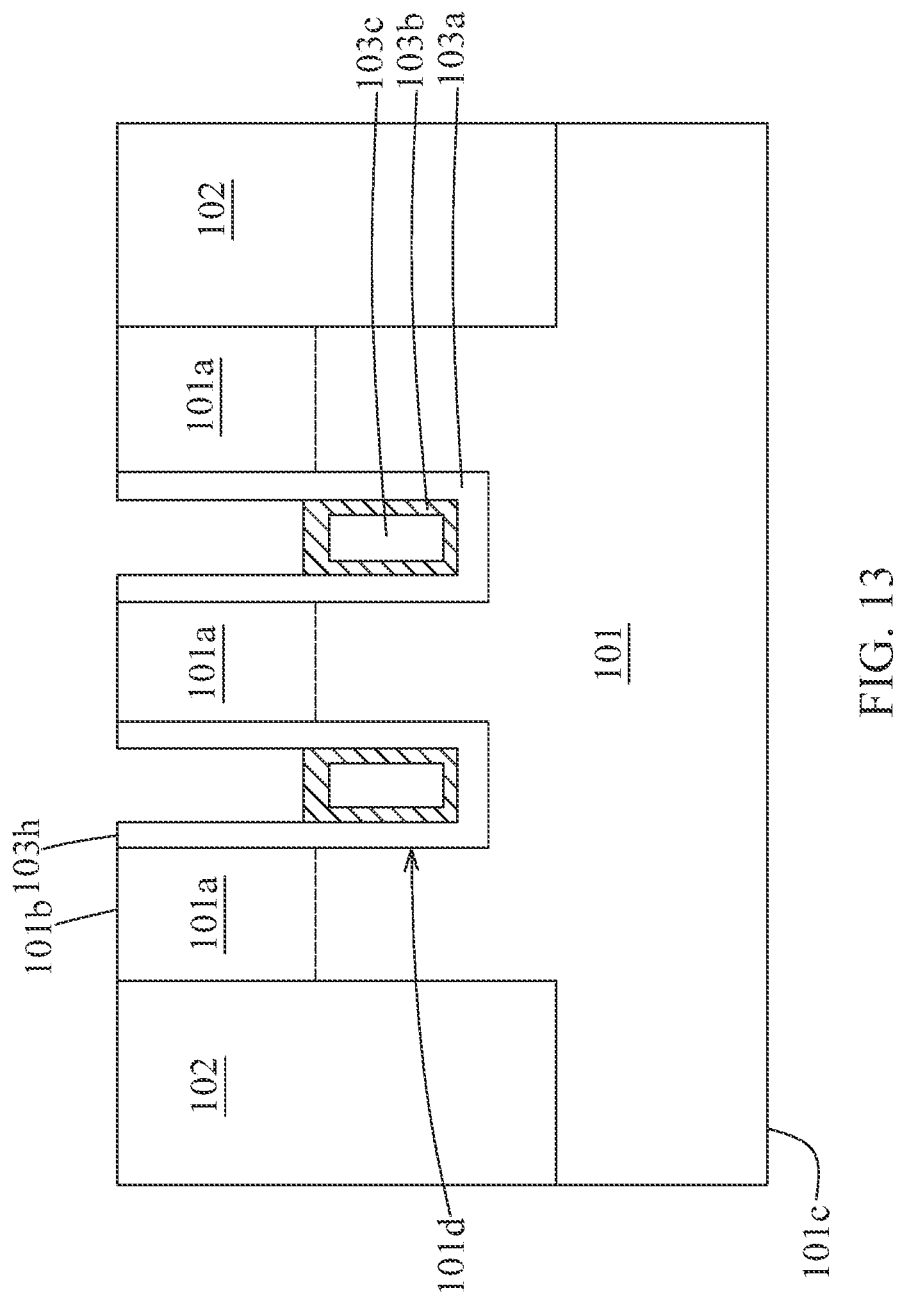

Referring to FIGS. 12 and 13, a third conductive material 106 is disposed over the conductive member 103c, and a portion of the first conductive material 105 above the third conductive material 106 is removed to form a conductive layer 103b according to step S606 in FIG. 6. In some embodiments, the conductive layer 103b encloses the conductive member 103c. In some embodiments, the third conductive material 106 is disposed on the conductive member 103c by deposition or any other suitable process. In some embodiments, the first conductive material 105 and the third conductive material 106 are a same material. In some embodiments, the third conductive material 106 includes titanium nitride (TiN). In some embodiments, after the disposing of the third conductive material 106 as shown in FIG. 12, a portion of the first conductive material 105 is removed to form the conductive layer 103b as shown in FIG. 13. In some embodiments, the portion of the first conductive material 105 is removed by etching, cleaning or any other suitable process.

Figure 14:
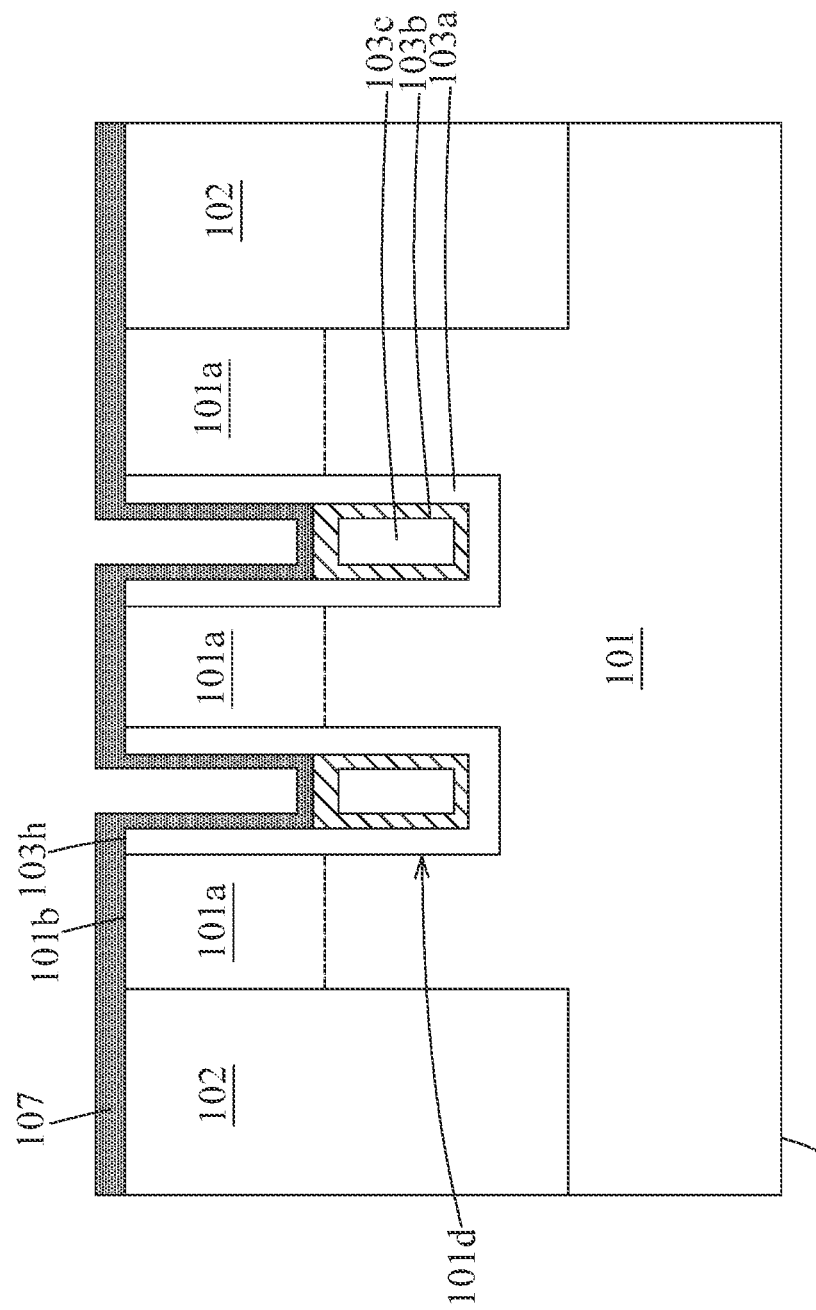
Figure 15:
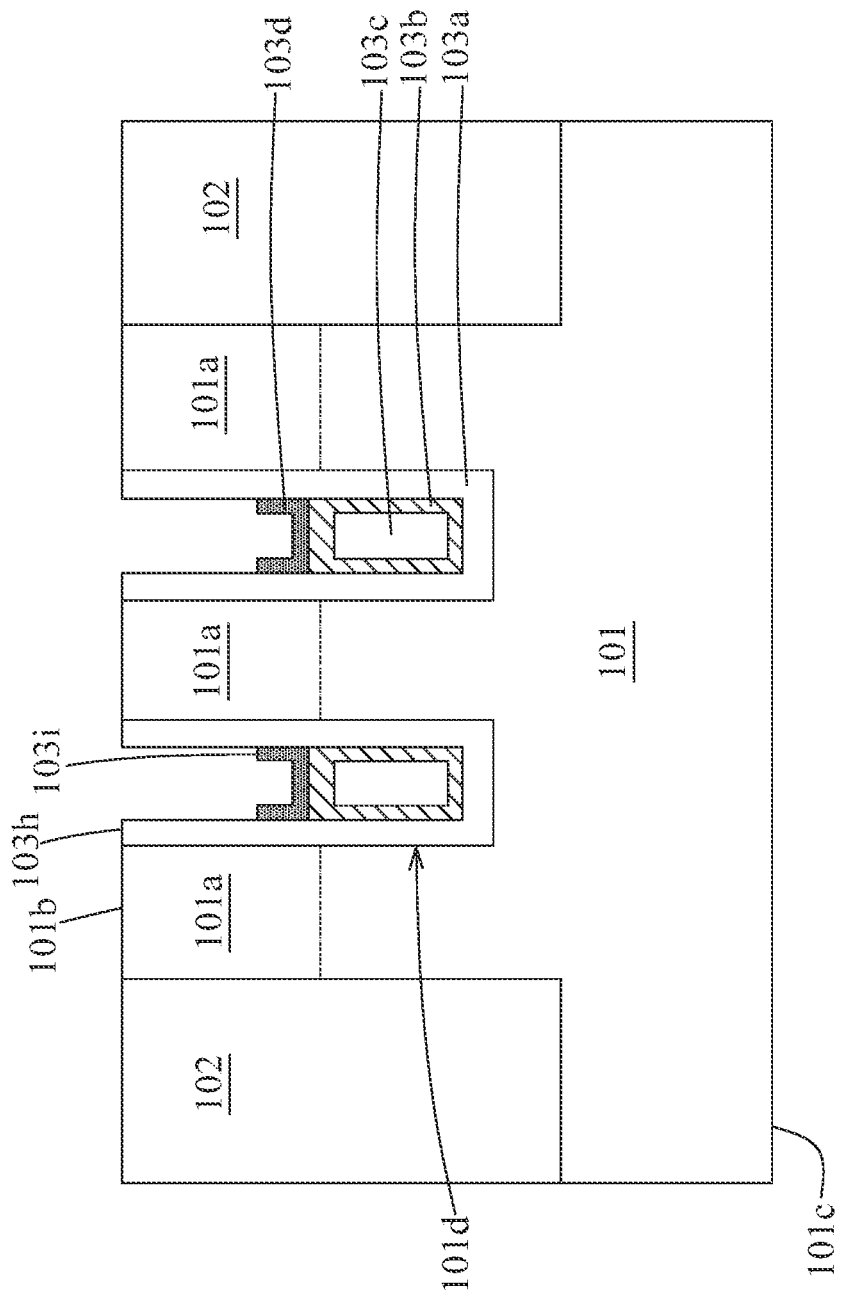

Referring to FIGS. 14 and 15, a second insulating layer 103d over the conductive layer 103b and conformal to the first insulating layer 103a is formed according to step S607 in FIG. 6. In some embodiments, the formation of the second insulating layer 103d includes disposing a first insulating material 107 over the semiconductor substrate 101, the isolation structure 102, the conductive layer 103b and the first insulating layer 103a. In some embodiments, the first insulating material 107 is disposed by atomic layer deposition (ALD) or any other suitable process.

In some embodiments, after the disposing of the first insulating material 107 as shown in FIG. 14, a portion of the first insulating material 107 disposed over the semiconductor substrate 101, the isolation structure 102 and the first insulating layer 103a is removed to form the second insulating layer 103d as shown in FIG. 15. In some embodiments, the portion of the first insulating material 107 is removed by anisotropic etching, planarization or any other suitable process. In some embodiments, a top surface 103i of the second insulating layer 103d is substantially lower than the top surface 103h of the first insulating layer 103a and the top surface 101b of the semiconductor substrate 101. In some embodiments, the formation of the second insulating layer 103d is performed after the formation of the conductive layer 103b and the formation of the conductive member 103c.

Figure 16:
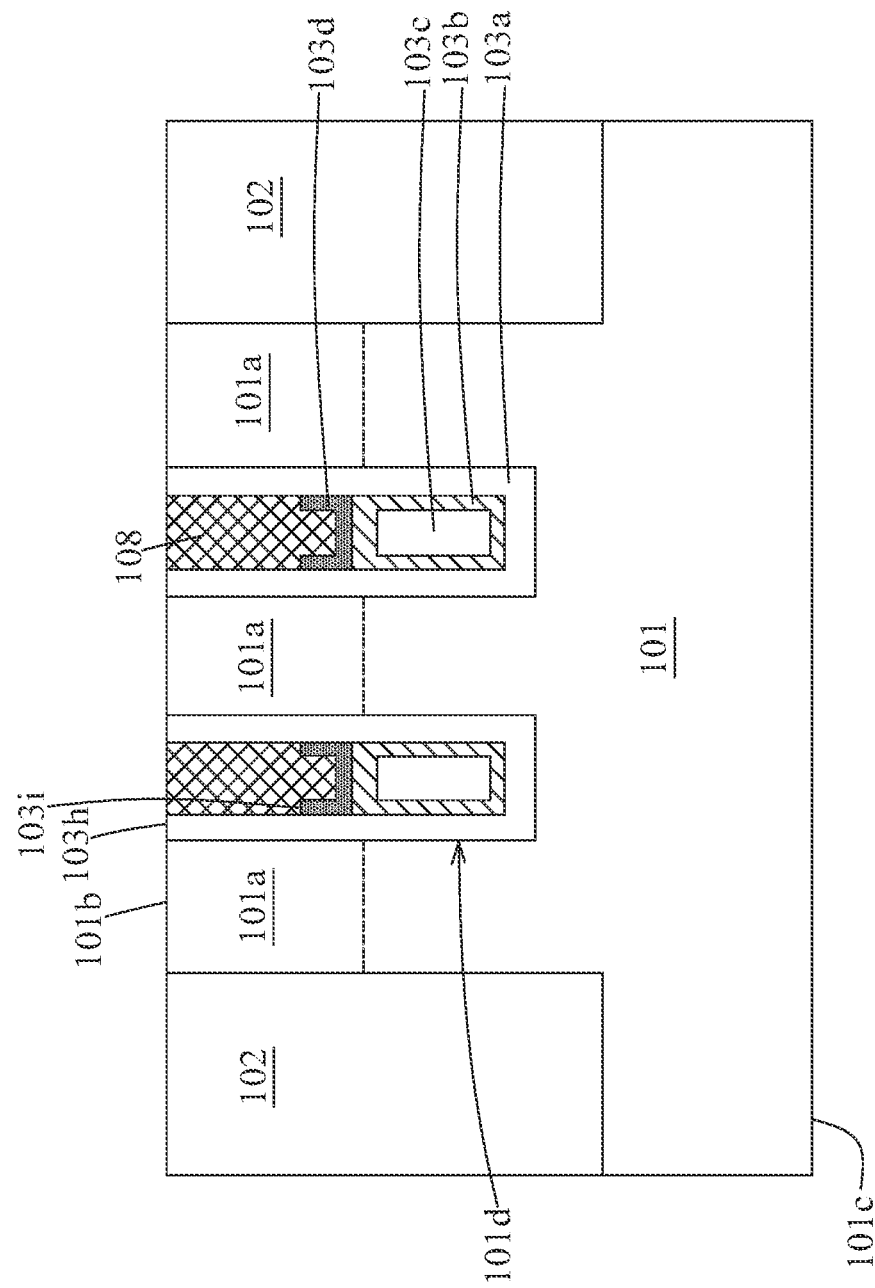
Figure 17:
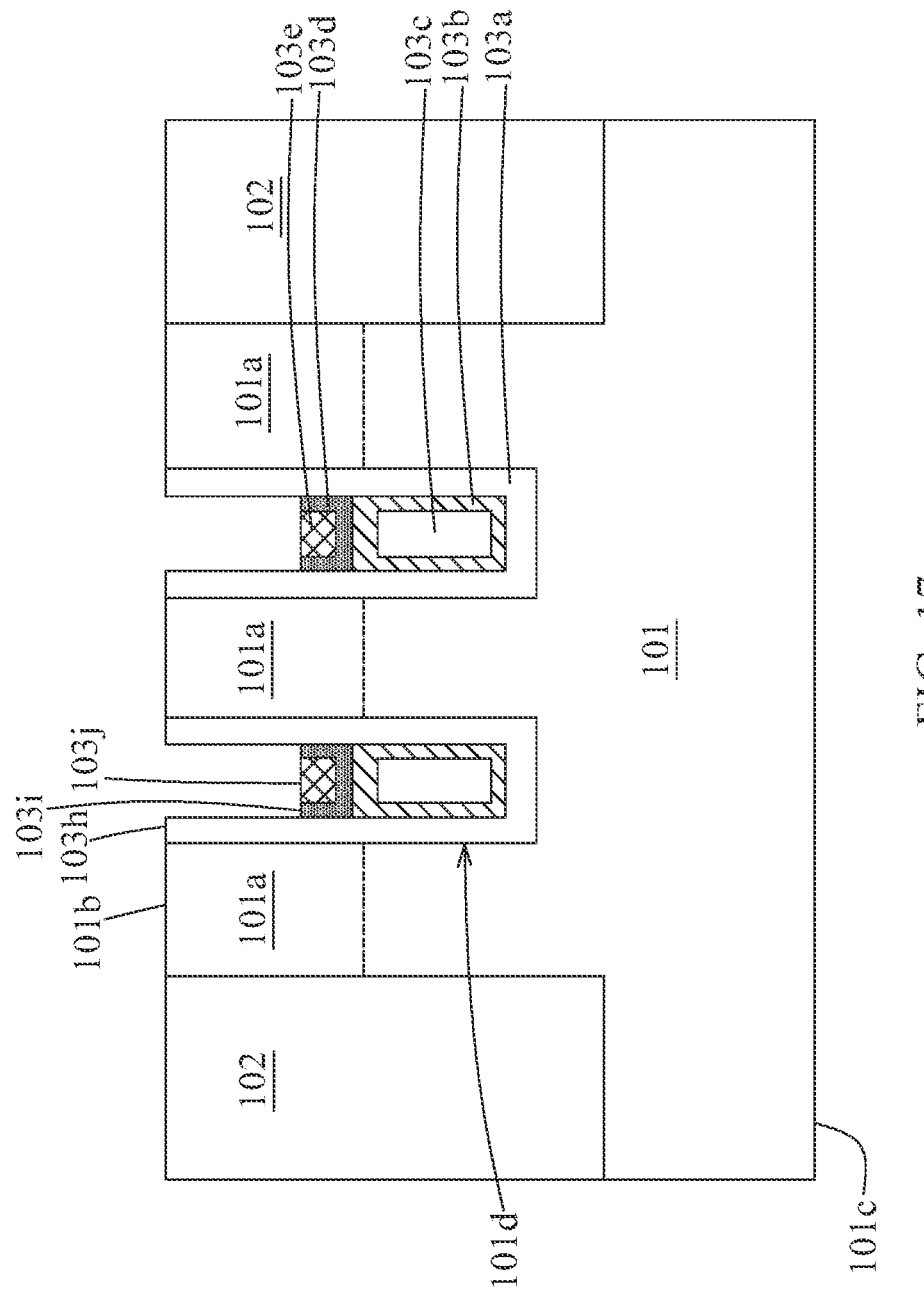

Referring to FIGS. 16 and 17, a work function member 103e over the conductive layer 103b and surrounded by the second insulating layer 103d is formed. In some embodiments, the work function member 103e is formed by disposing a work function material 108 surrounded by the second insulating layer 103d and the first insulating layer 103a as shown in FIG. 16, and then removing a portion of the work function material 108 to form the work function member 103e as shown in FIG. 17. In some embodiments, the work function material 108 is disposed by deposition, CND or any other suitable process. In some embodiments, the portion of the work function material 108 is removed by etching or any other suitable process. In some embodiments, the work function material 108 includes polysilicon. In some embodiments, a top surface 103j of the work function member 103e is substantially coplanar with the top surface 103i of the second insulating layer 103d.

Figure 18:
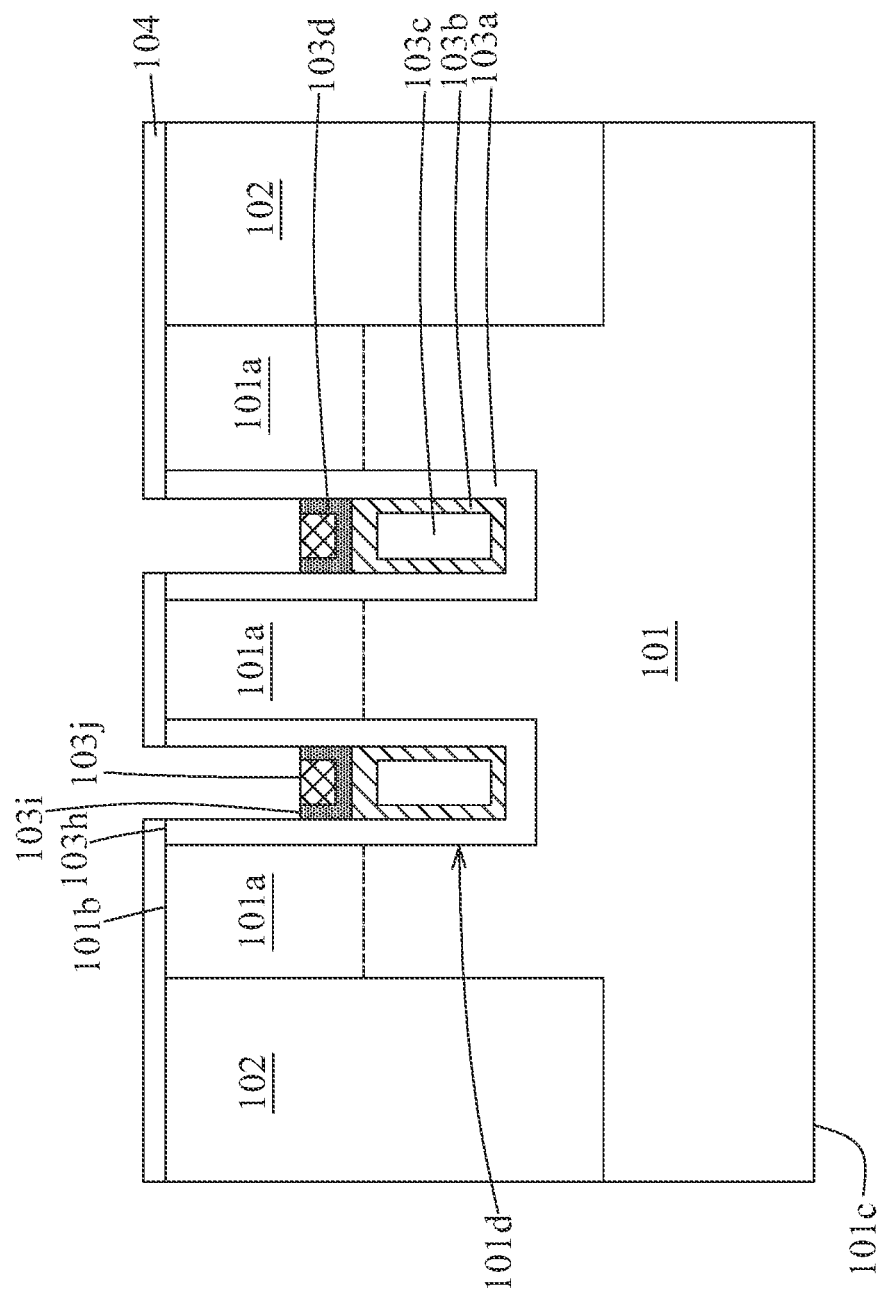

Referring to FIG. 18, a mask layer 104 is formed over the semiconductor substrate 101, the isolation structure 102 and the first insulating layer 103a. In some embodiments, the mask layer 104 is in contact with the top surface 103h of the first insulating layer 103a. In some embodiments, the mask layer 104 is formed by disposing a masking material such as nitride.

Figure 19:
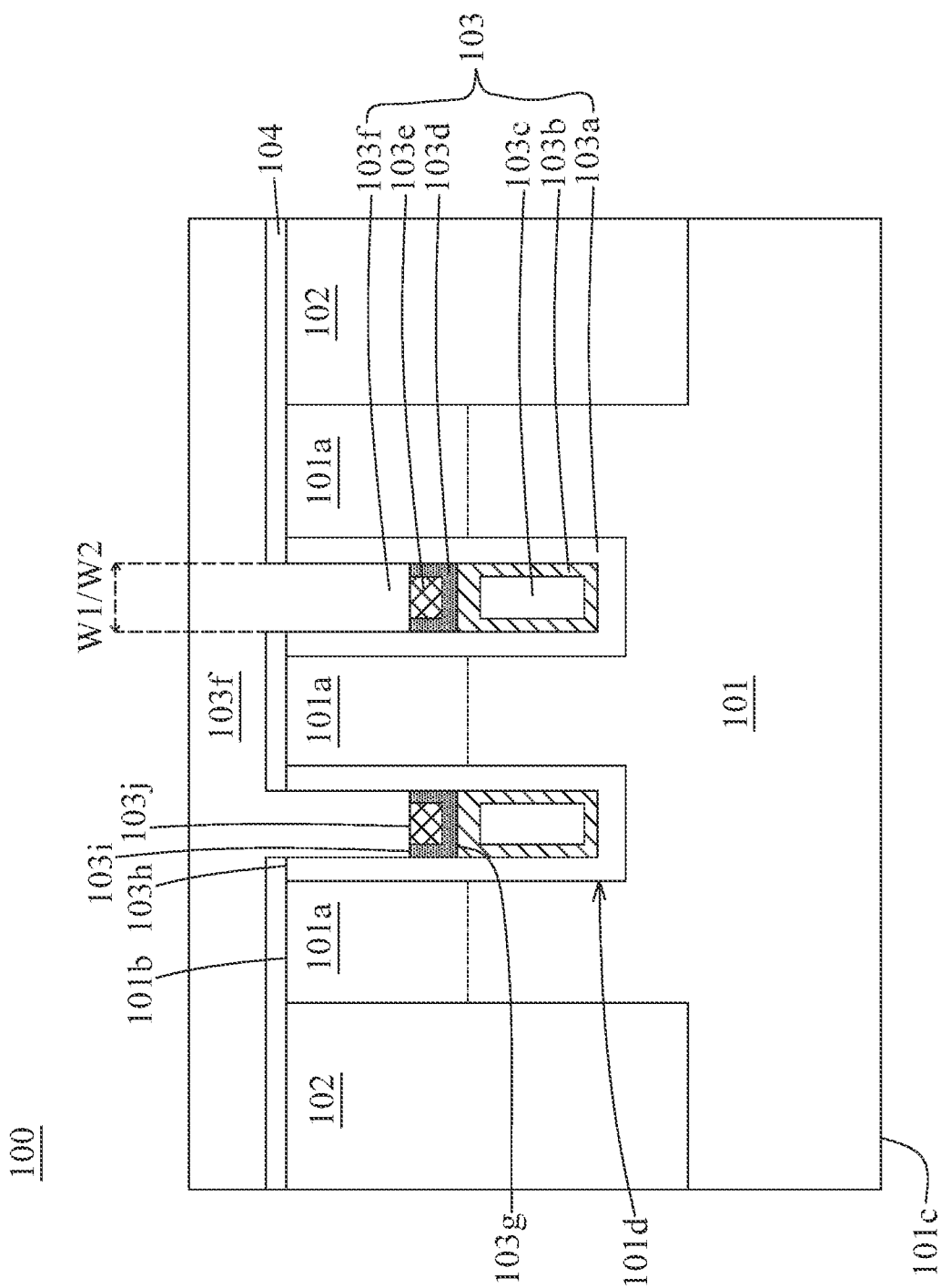

Referring to FIG. 19, a gate insulating member 103f is formed over the work function member 103e, the second insulating layer 103d and the mask layer 104. In some embodiments, the formation of the gate insulating member 103f includes disposing a gate insulating material by deposition or any other suitable process. In some embodiments, the memory device 100 of FIG. 1 is formed as shown in FIG. 19.

Figure 20:
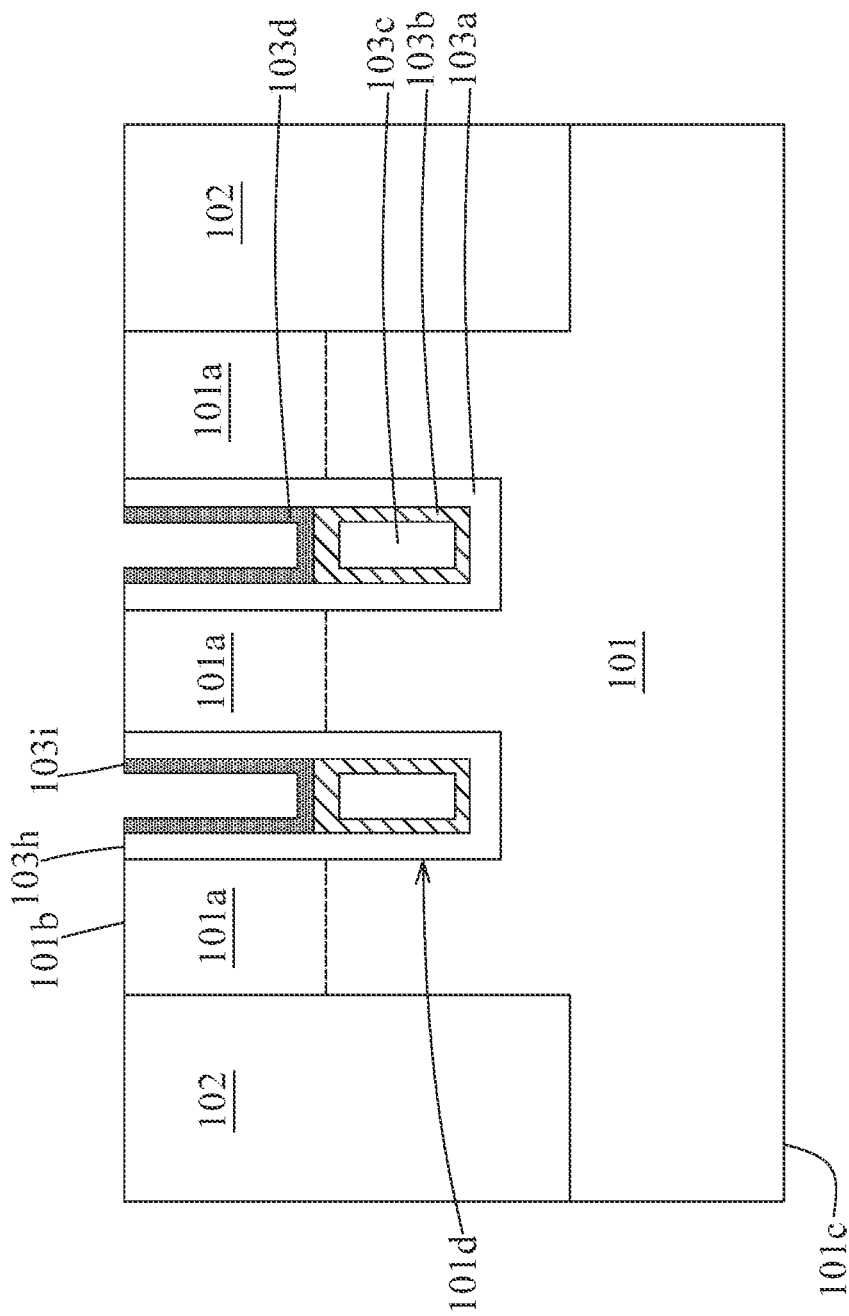

In some embodiments, the memory device 200 of FIG. 2 can be formed by the following steps after the disposing of the first insulating material 107 as shown in FIG. 14. After the disposing of the first insulating material 107 as shown in FIG. 14, a portion of the first insulating material 107 disposed over the semiconductor substrate 101, the isolation structure 102 and the first insulating layer 103a is removed to form the second insulating layer 103d as shown in FIG. 20. In some embodiments, the portion of the first insulating material 107 is removed by anisotropic etching, planarization or any other suitable process. In some embodiments, the top surface 103*i* of the second insulating layer 103*d* is substantially coplanar with the top surface 103*h* of the first insulating layer 103*a* and the top surface 101*b* of the semiconductor substrate 101.

Figure 21:
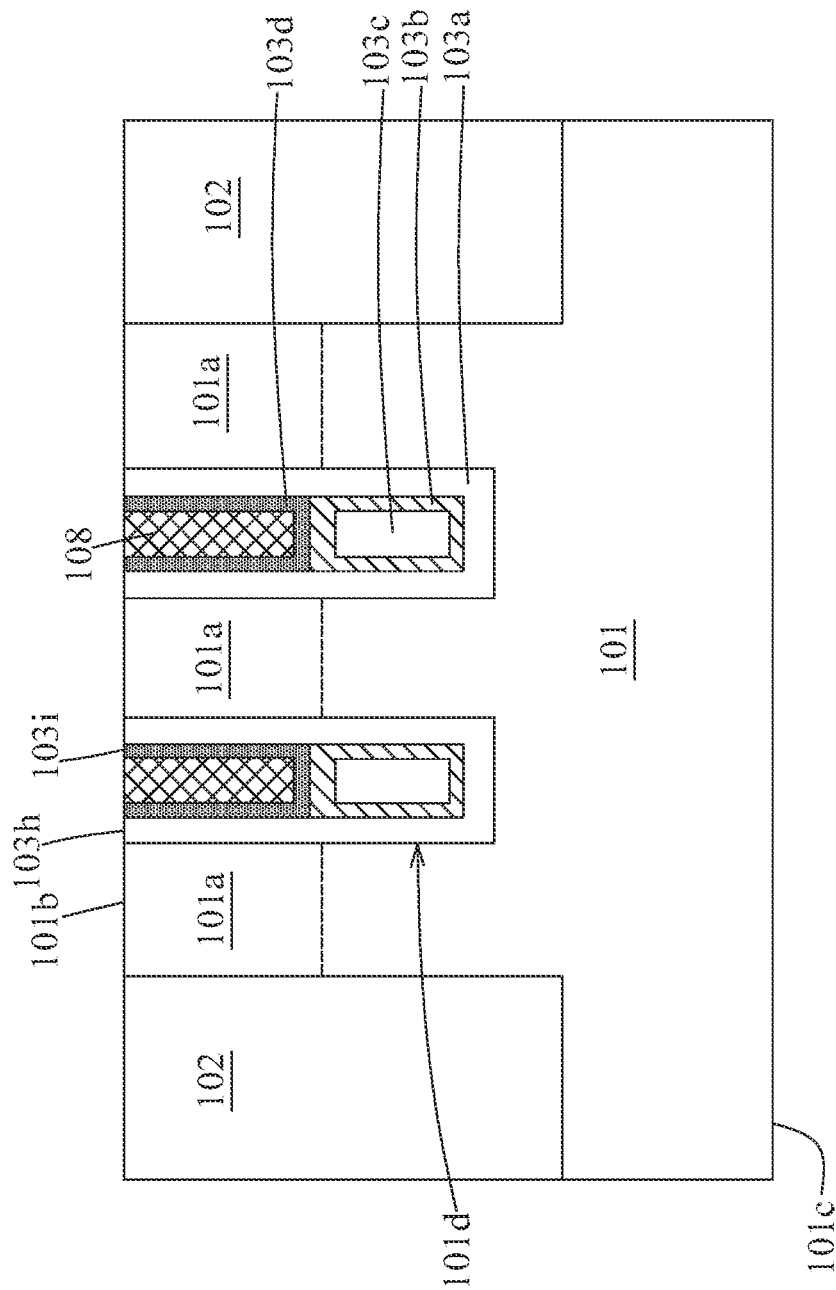
Figure 22:
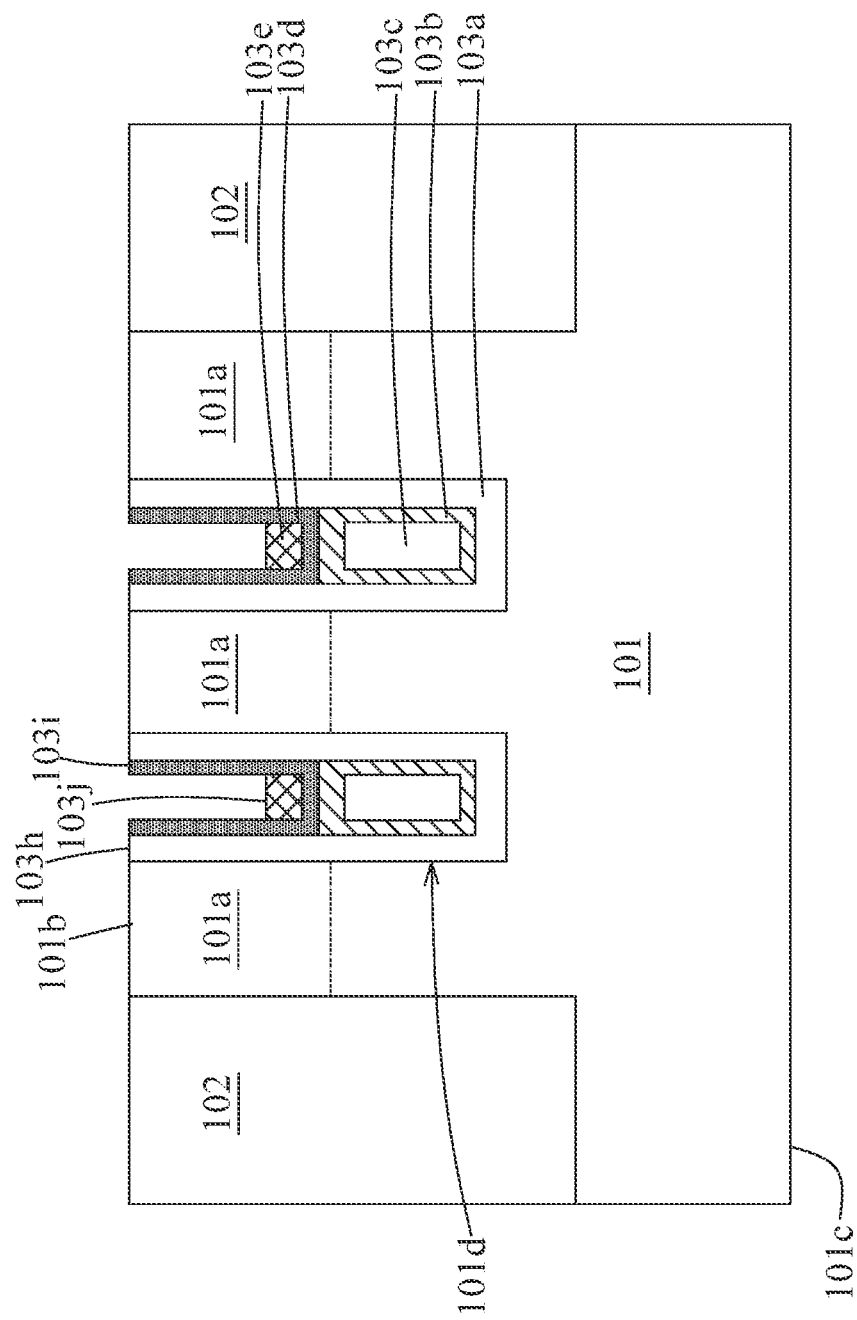

In some embodiments, after the formation of the second insulating layer 103*d*, the work function member 103*e* is formed as shown in FIGS. 21 and 22, in a manner similar to the steps as discussed above and illustrated in FIGS. 16 and 17. In some embodiments, the top surface 103*j* of the work function member 103*e* is substantially lower than the top surface 103*i* of the second insulating layer 103*d*.

Figure 23:
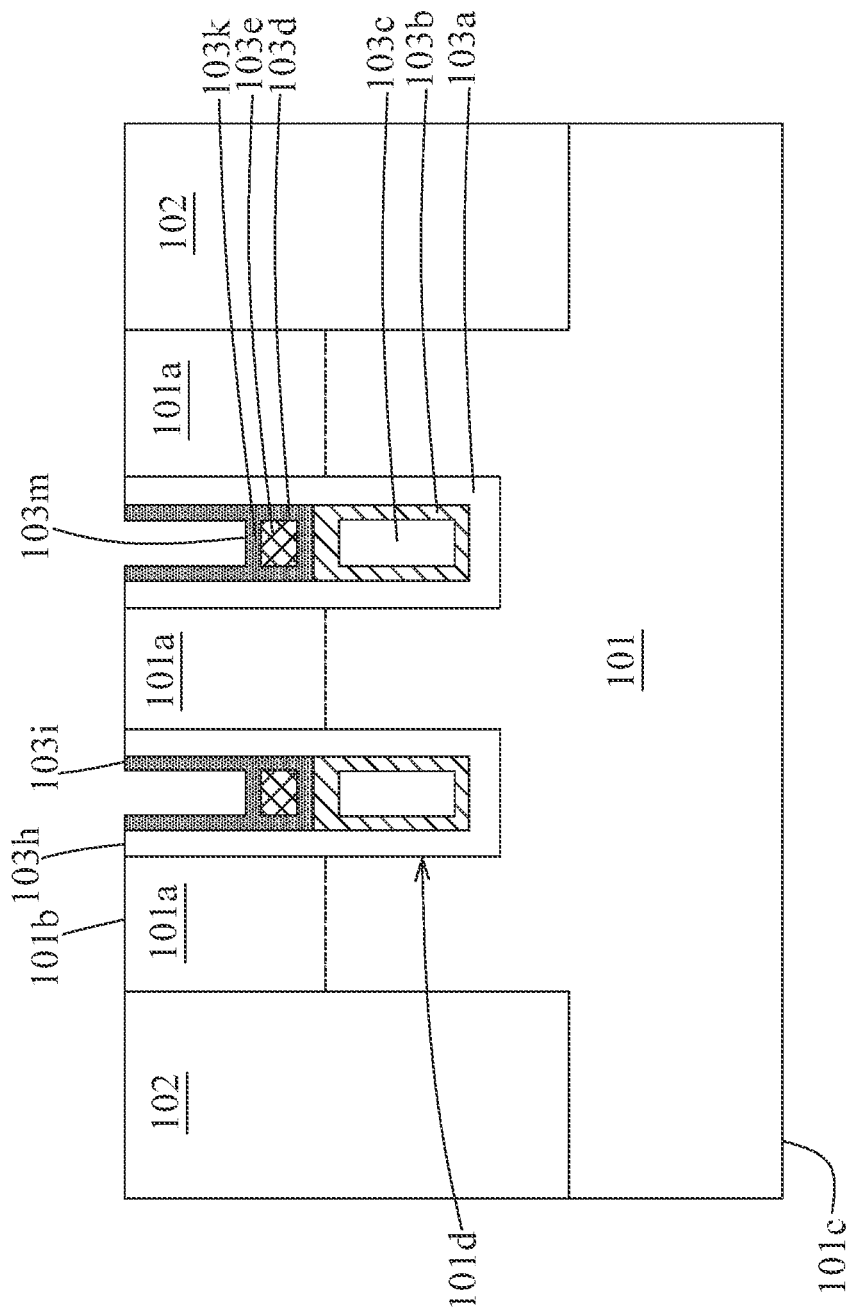

In some embodiments, after the formation of the work function member 103*e* as shown in FIG. 22, a third insulating layer 103*k* is formed over the work function member 103*e*, wherein the third insulating layer 103*k* is surrounded by the second insulating layer 103*d*, as shown in FIG. 23. In some embodiments, the formation of the third insulating layer 103*k* includes disposing a second insulating material over the work function member 103*e*. In some embodiments, the second insulating material is disposed by atomic layer deposition (ALD) or any other suitable process. In some embodiments, a top surface 103*m* of the third insulating layer 103*k* is substantially lower than the top surface 103*i* of the second insulating layer 103*d*. In some embodiments, the first insulating material 107 and the second insulating material include a same material. In some embodiments, the second insulating layer 103*d* and the third insulating layer 103*k* are integrally formed.

Figure 24:
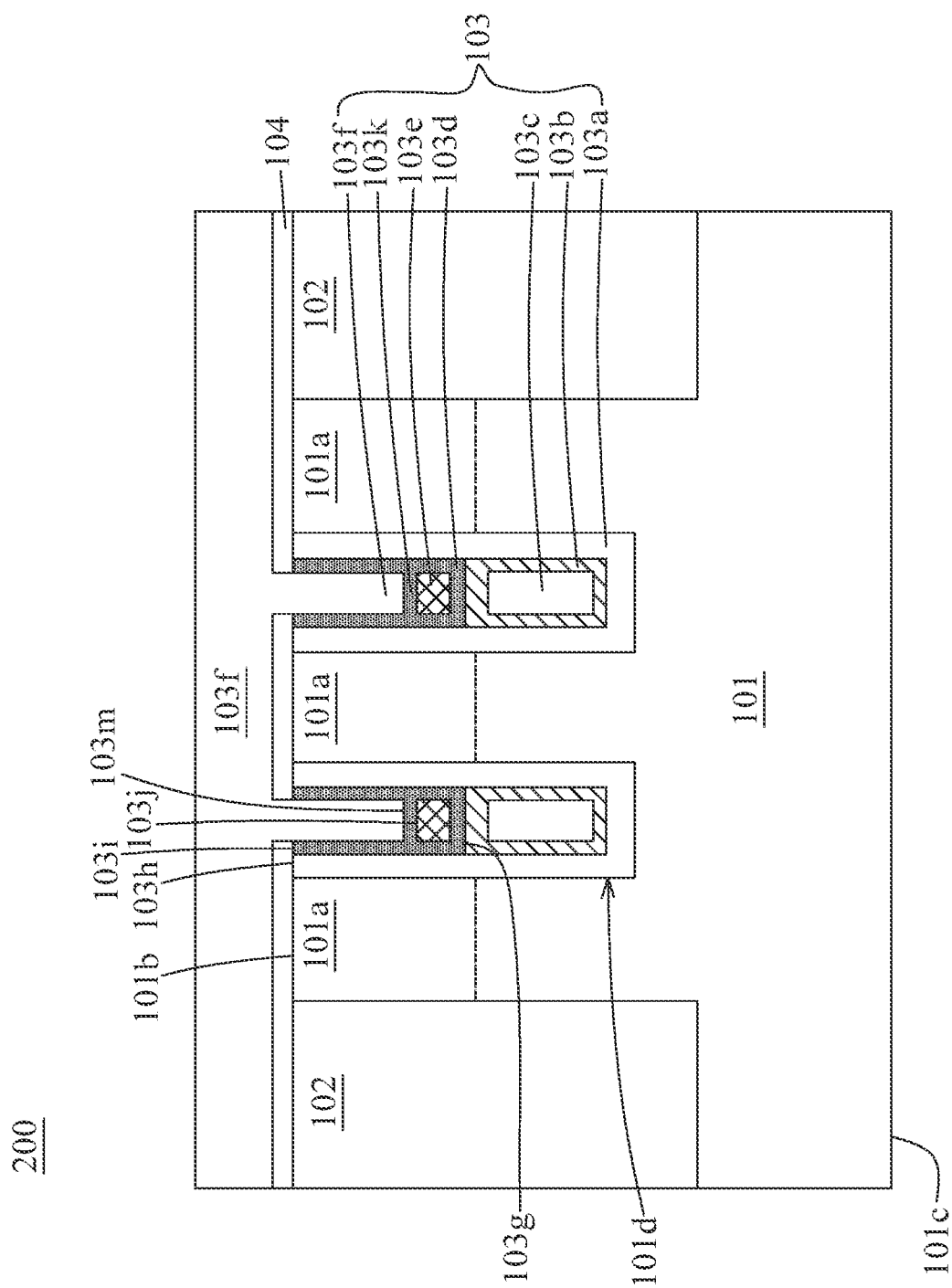

In some embodiments, after the formation of the third insulating layer 103*m*, the mask layer 104 and the gate insulating member 103*f* are formed in a manner similar to the steps as discussed above and illustrated in FIGS. 18 and 19. In some embodiments, the memory device 200 of FIG. 2 is formed as shown in FIG. 24.

Figure 25:
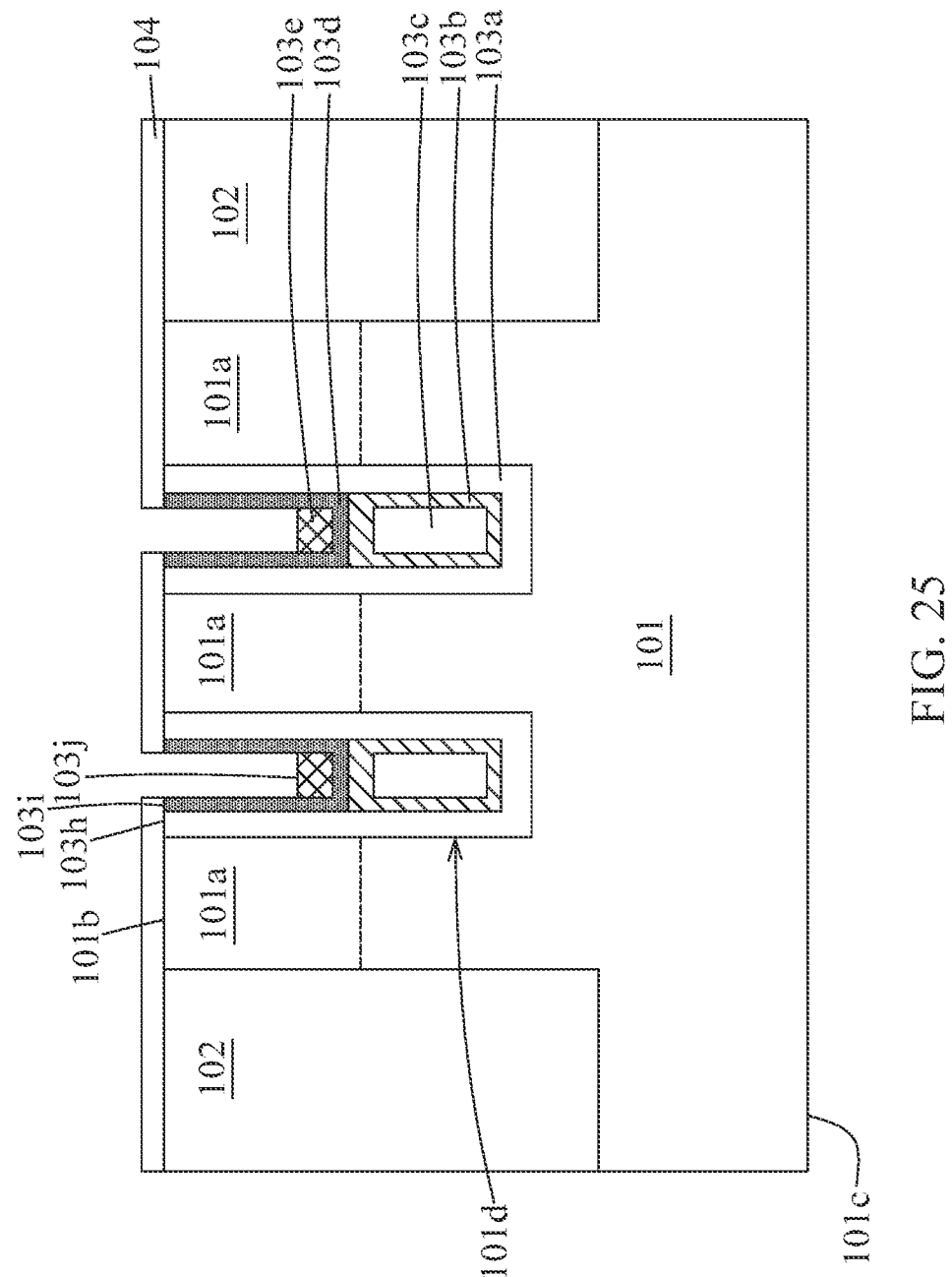
Figure 26:
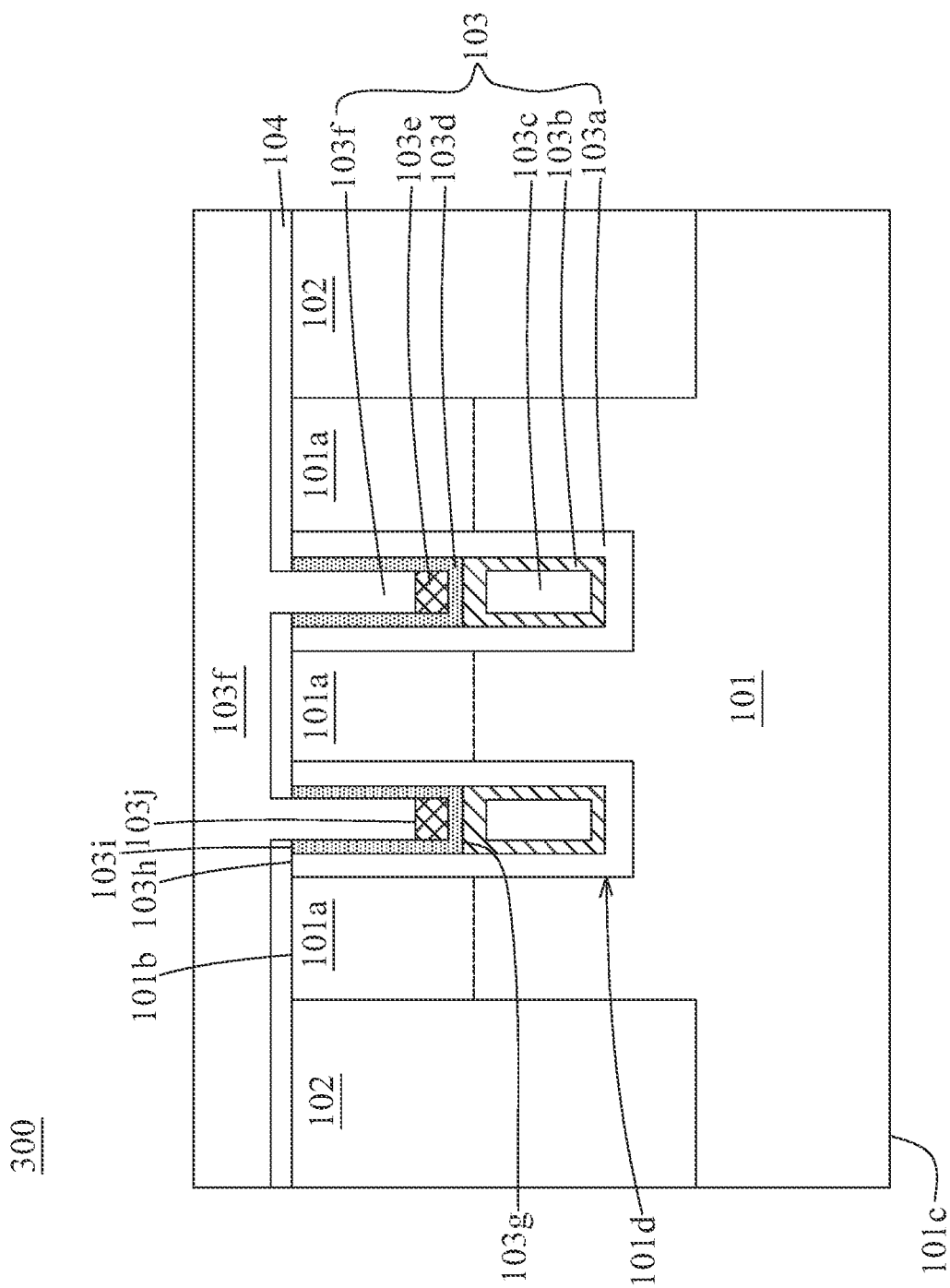

In some embodiments, the memory device 300 of FIG. 3 can be formed by the following steps after the formation of the second insulating layer 103*d* as shown in FIG. 22. After the formation of the second insulating layer 103*d* as shown in FIG. 22, the mask layer 104 is disposed over the first insulating layer 103*a* and the second insulating layer 103*d* as shown in FIG. 25. In some embodiments, the mask layer 104 is disposed in a manner similar to the steps as discussed above and illustrated in FIG. 18. After the disposing of the mask layer 104, the gate insulating member 103*f* is formed in a manner similar to the steps as discussed above and illustrated in FIG. 19. In some embodiments, the memory device 300 of FIG. 3 is formed as shown in FIG. 26.

Figure 27:
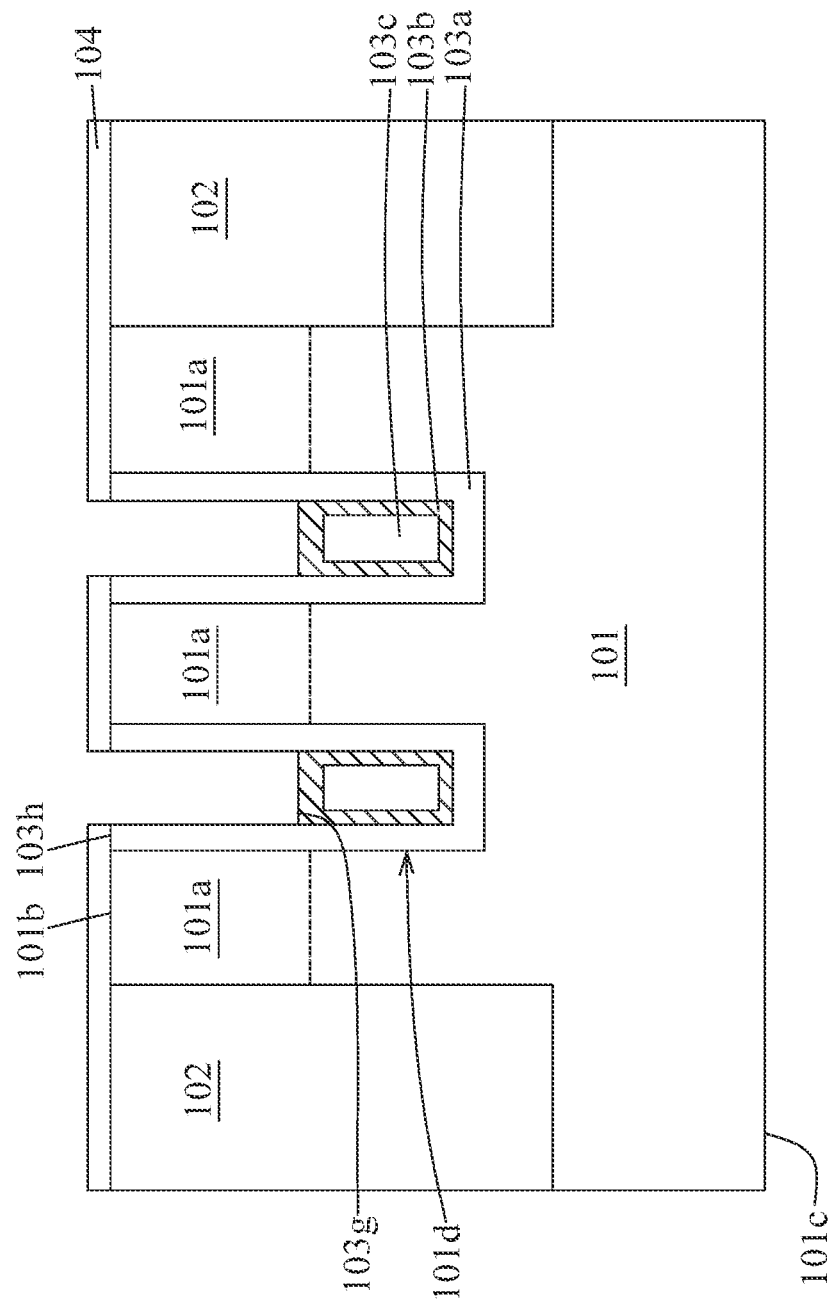

In some embodiments, the memory device 400 of FIG. 4 can be formed by the following steps after the formation of the conductive layer 103*b* as shown in FIG. 13. After the formation of the conductive layer 103*b* as shown in FIG. 13, the mask layer 104 is disposed over the first insulating layer 103*a*, the semiconductor substrate 101 and the isolation structure 102 as shown in FIG. 27. In some embodiments, the mask layer 104 is disposed in a manner similar to the steps as discussed above and illustrated in FIG. 18.

Figure 28:
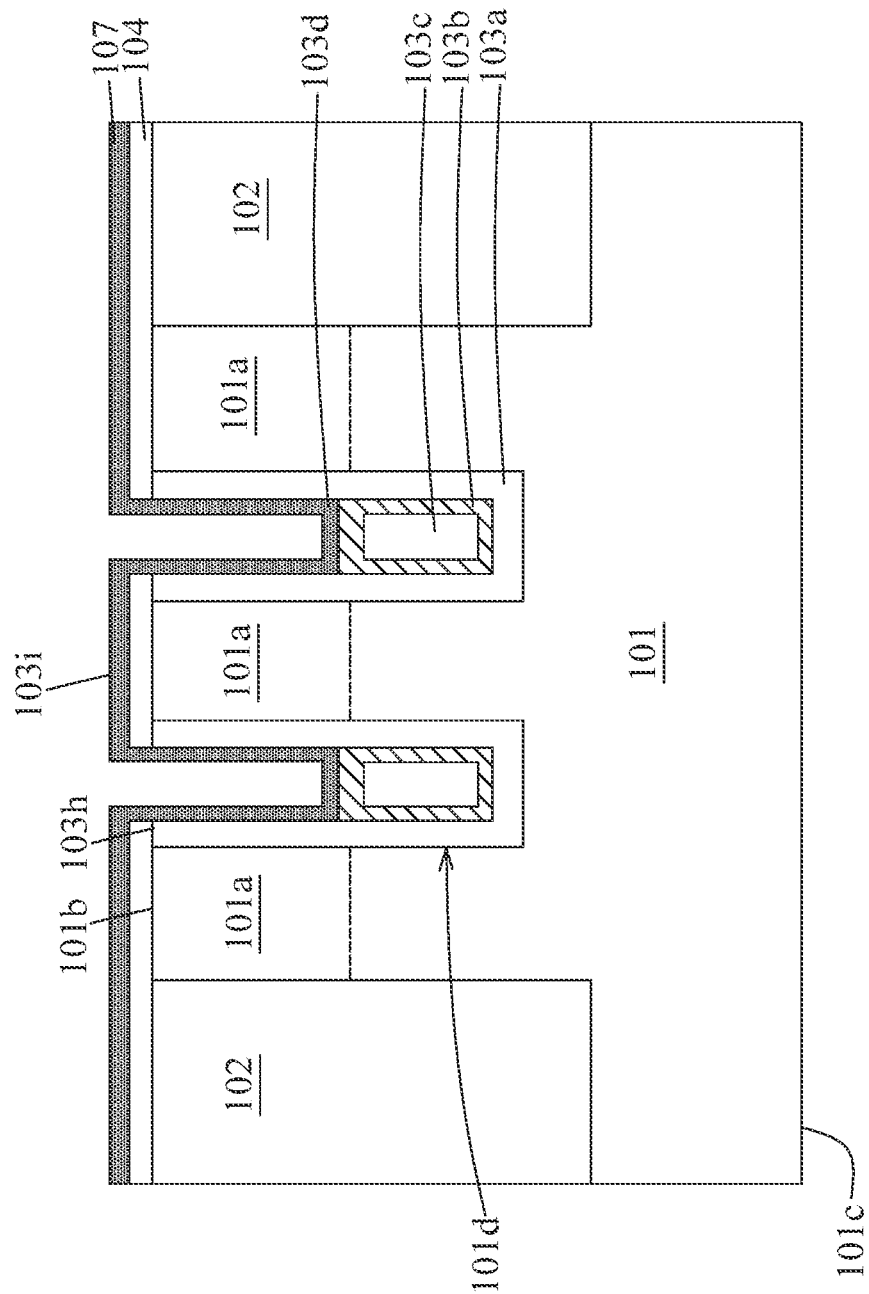

In some embodiments, after the disposing of the mask layer 104, the first insulating material 107 is disposed over the mask layer 104 and the conductive layer 103*b* and conformal to the first insulating layer 103*a* as shown in FIG. 28. In some embodiments, the first insulating material 107 is disposed in a manner similar to the steps as discussed above and illustrated in FIG. 14. In some embodiments, the second insulating layer 103*d* is formed as shown in FIG. 28.

Figure 29:
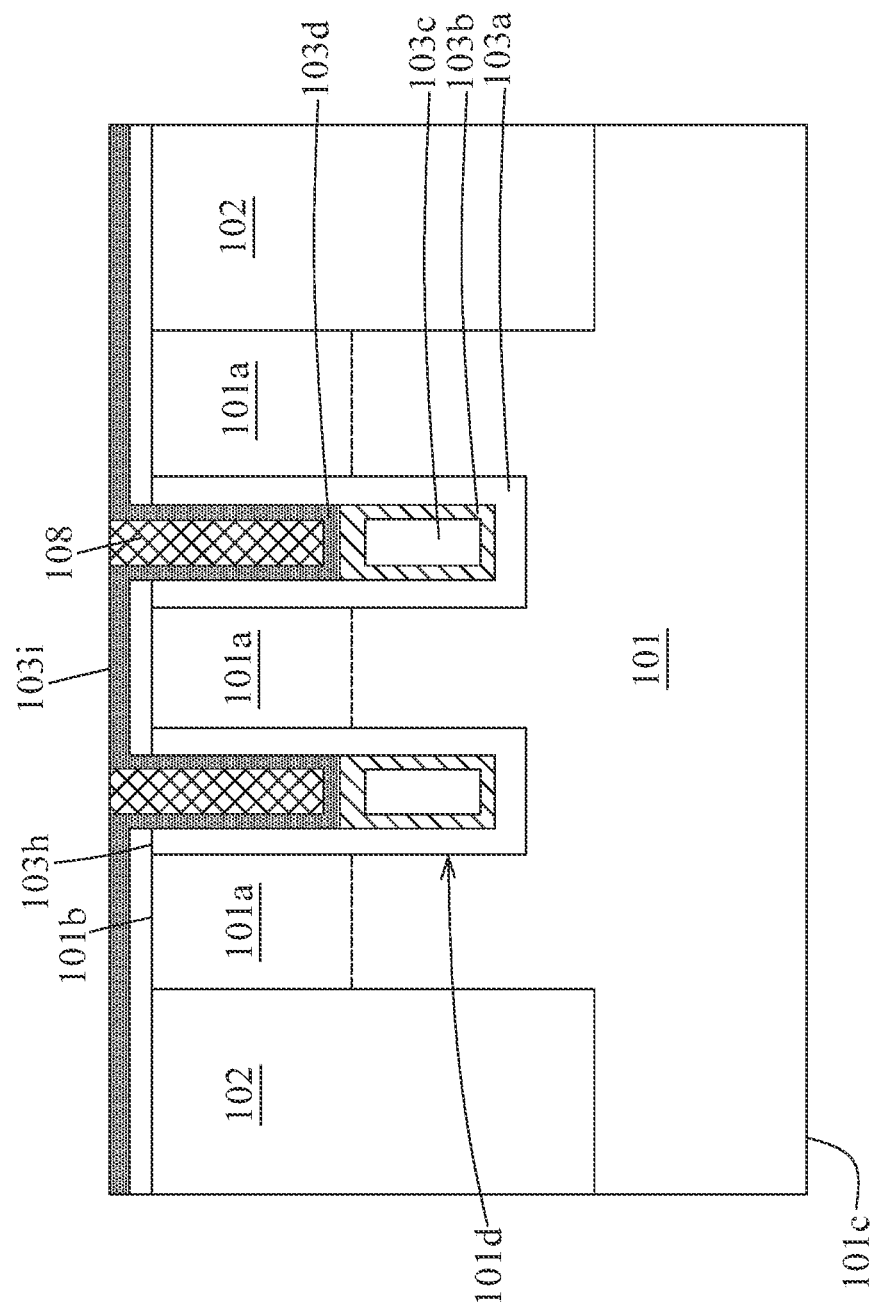
Figure 30:
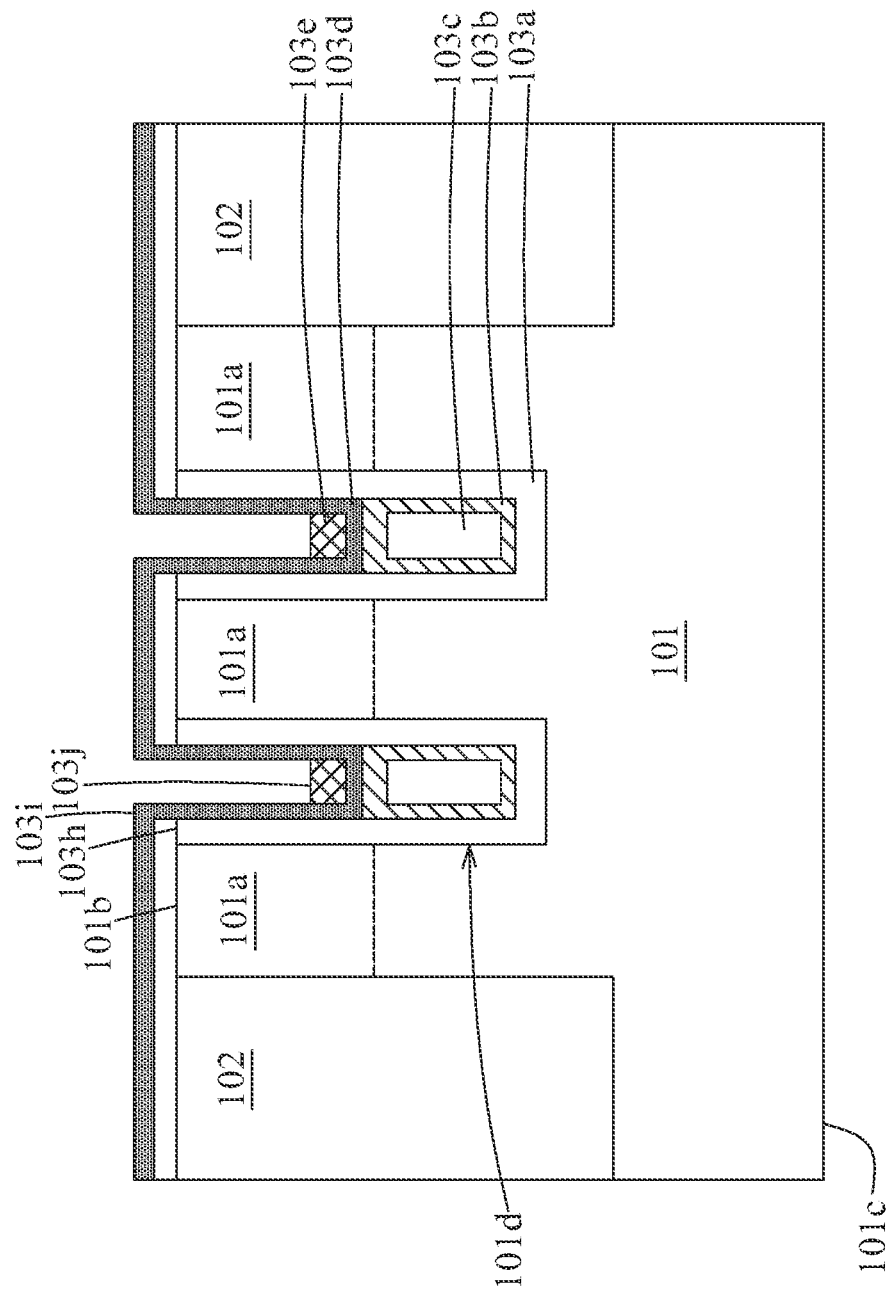

In some embodiments, after the formation of the second insulating layer 103*d*, the work function material 108 is disposed as shown in FIG. 29. In some embodiments, the work function material 108 is disposed in a manner similar to the steps as discussed above and illustrated in FIG. 16. In some embodiments, after the disposing of the work function material 108, a portion of the work function material 108 is removed to form the work function member 103*e* as shown in FIG. 30. In some embodiments, the portion of the work function material 108 is removed in a manner similar to the steps as discussed above and illustrated in FIG. 17.

Figure 31:
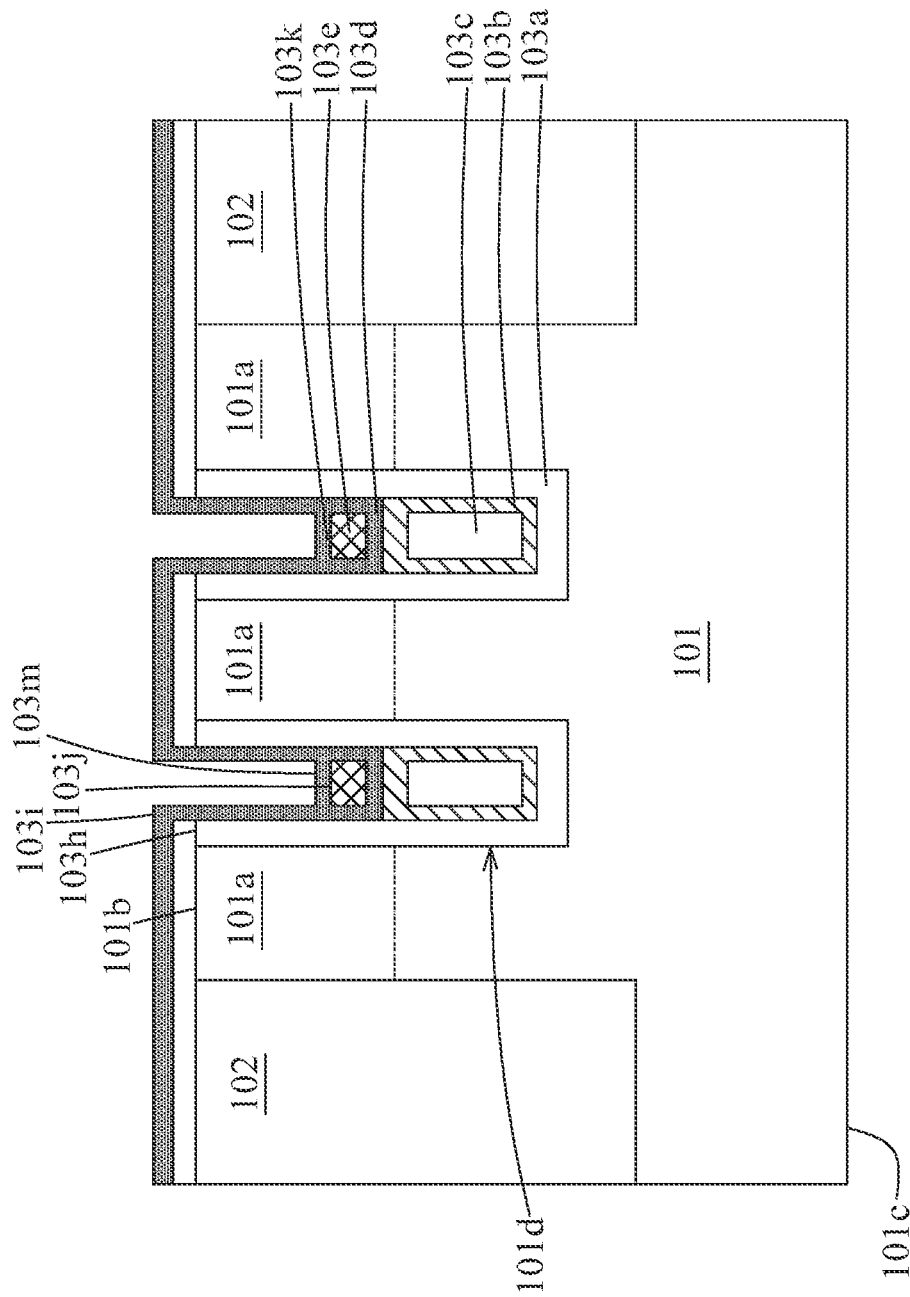
Figure 32:
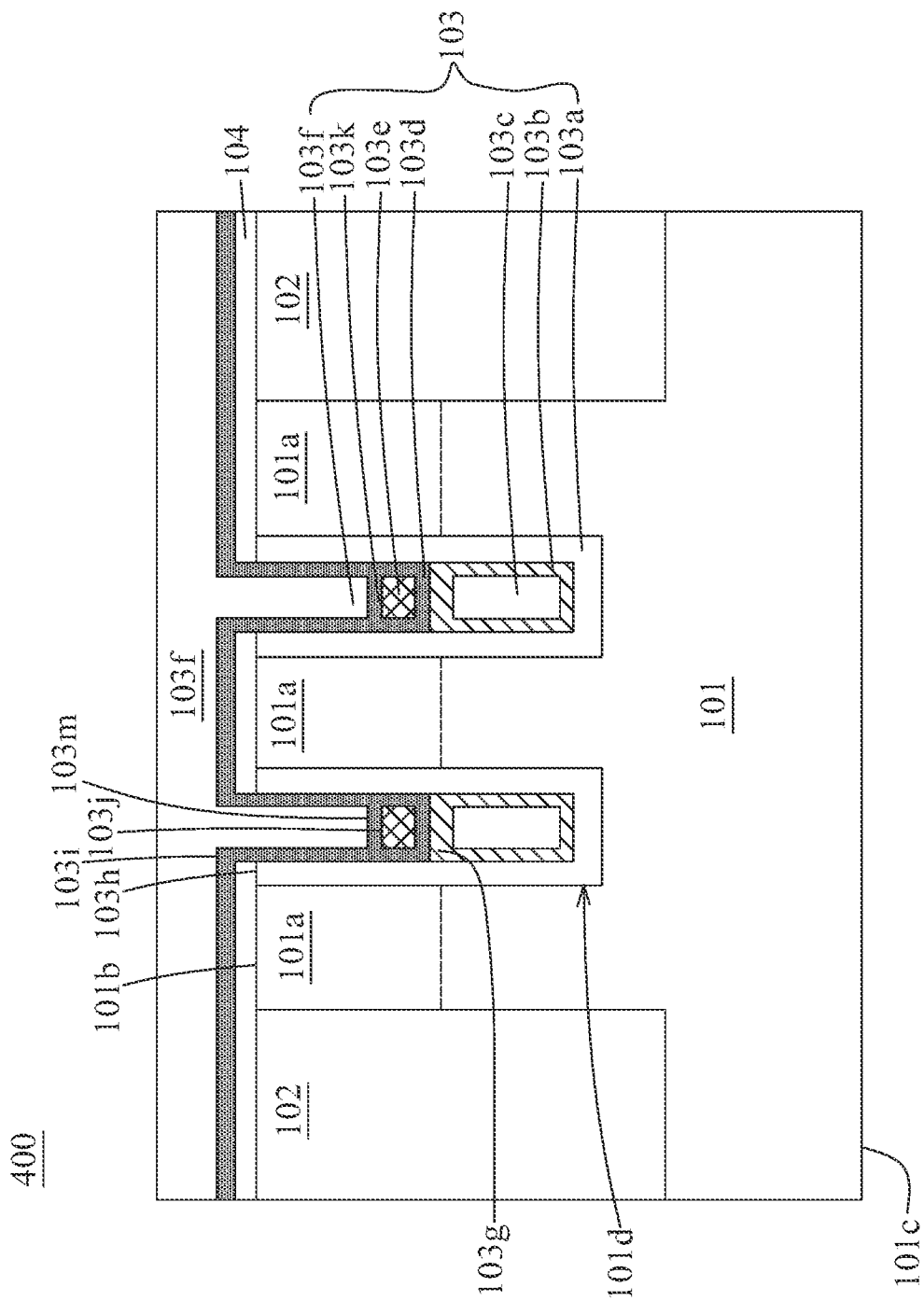

In some embodiments, after the formation of the work function member 103*e*, the third insulating layer 103*k* is disposed over the work function member 103*e* as shown in FIG. 31. In some embodiments, the third insulating layer 103*k* is disposed in a manner similar to the steps as discussed above and illustrated in FIG. 23. In some embodiments, after the formation of the third insulating layer 103*k*, the gate insulating member 103*f* is formed over the second insulating layer 103*d* and the third insulating layer 103*k* as shown in FIG. 32. In some embodiments, the gate insulating member 103*f* is formed in a manner similar to the steps as discussed above or illustrated in FIG. 19. In some embodiments, the memory device 400 of FIG. 4 is formed as shown in FIG. 32.

Figure 33:
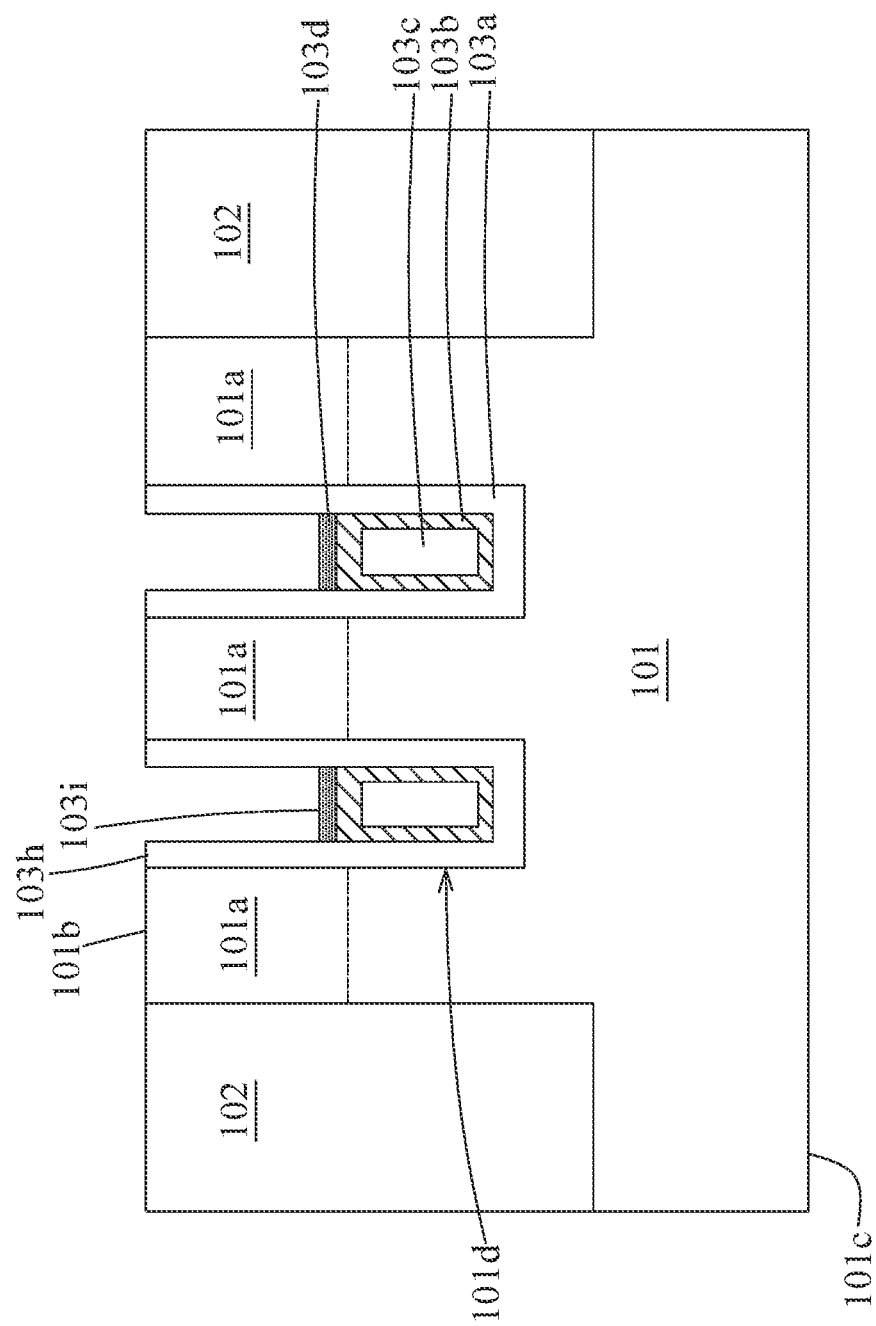
Figure 34:
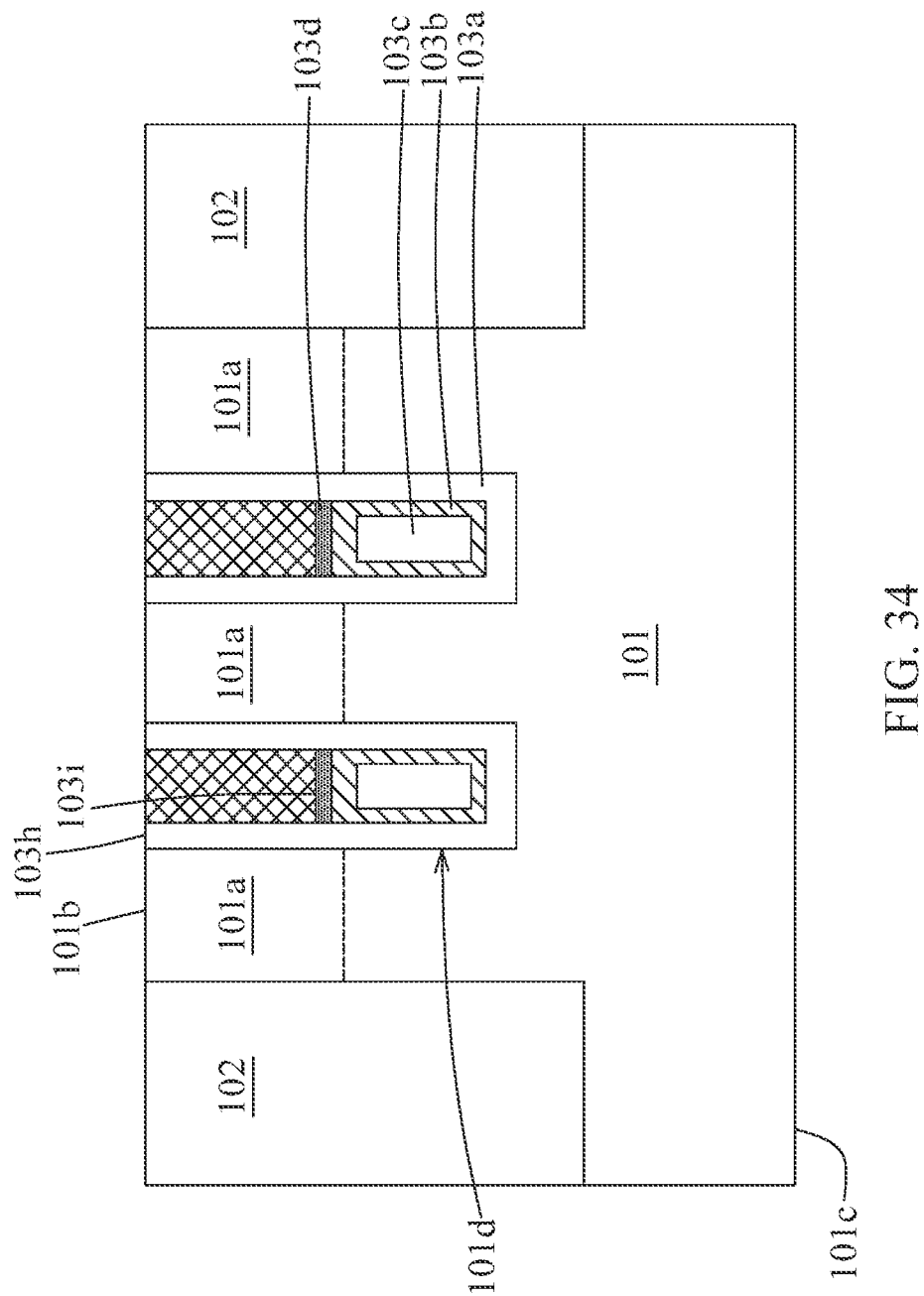

In some embodiments, the memory device 500 of FIG. 5 can be firmed by the following steps after the formation of the conductive layer 103*h* as shown in FIG. 13. In some embodiments, after the formation of the conductive layer 103*b* as shown in FIG. 13, a second insulating layer 103*d* is formed over the conductive layer 103*b* as shown in FIG. 33. In some embodiments, the second insulating layer 103*d* is formed in a manner similar to the steps as discussed above and illustrated in FIGS. 14 and 15.

Figure 35:
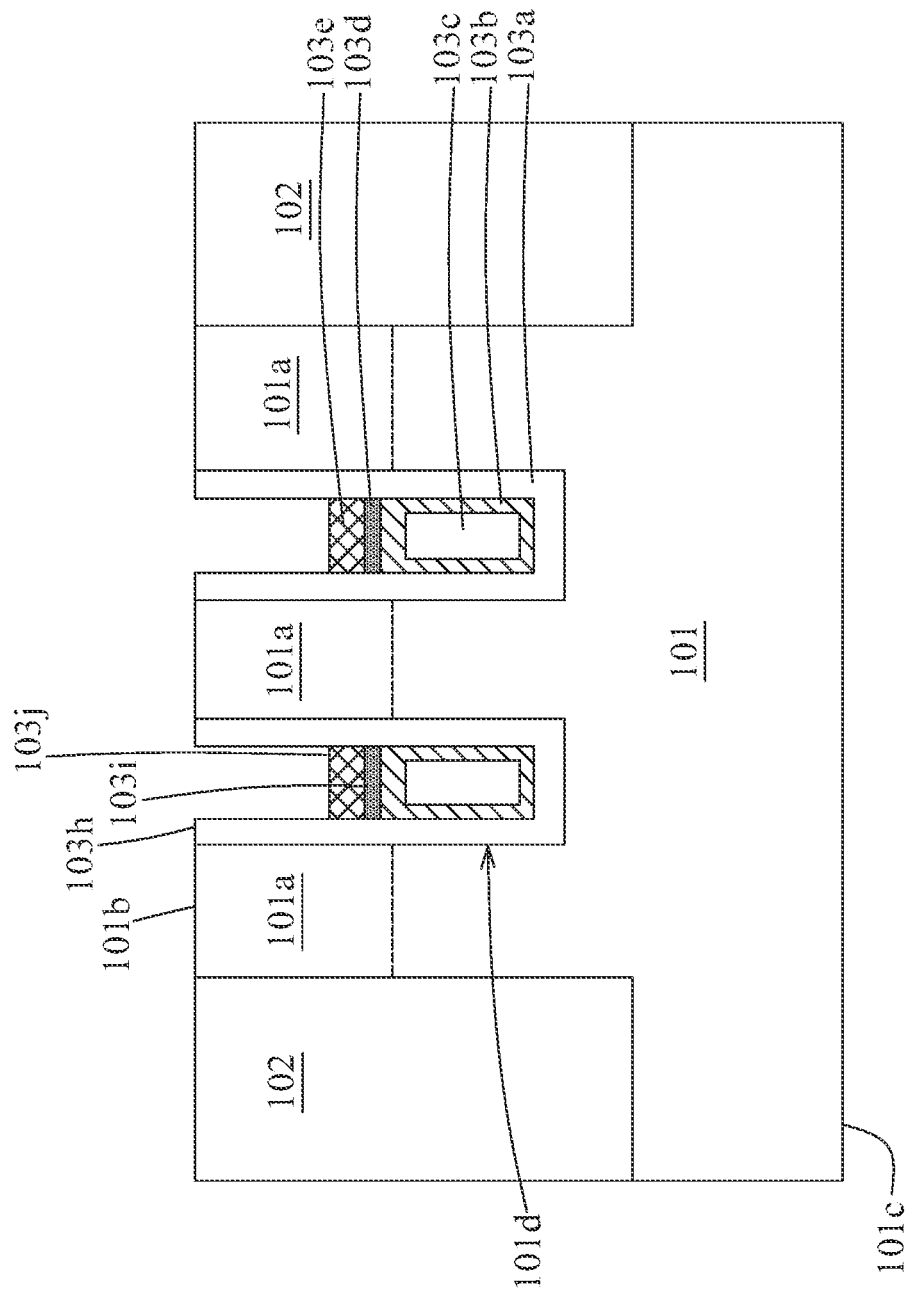

In some embodiments, after the formation of the second insulating layer 103*d*, the work function member 103*e* is formed as shown in FIG. 35. In some embodiments, the work function member 103*e* is formed in a manner similar to the steps as discussed above and illustrated in FIGS. 16 and 17. In some embodiments, the top surface 103*i* of the second insulating layer 103*d* is substantially lower than the top surface 103*j* of the work function member 103*e*.

Figure 36:
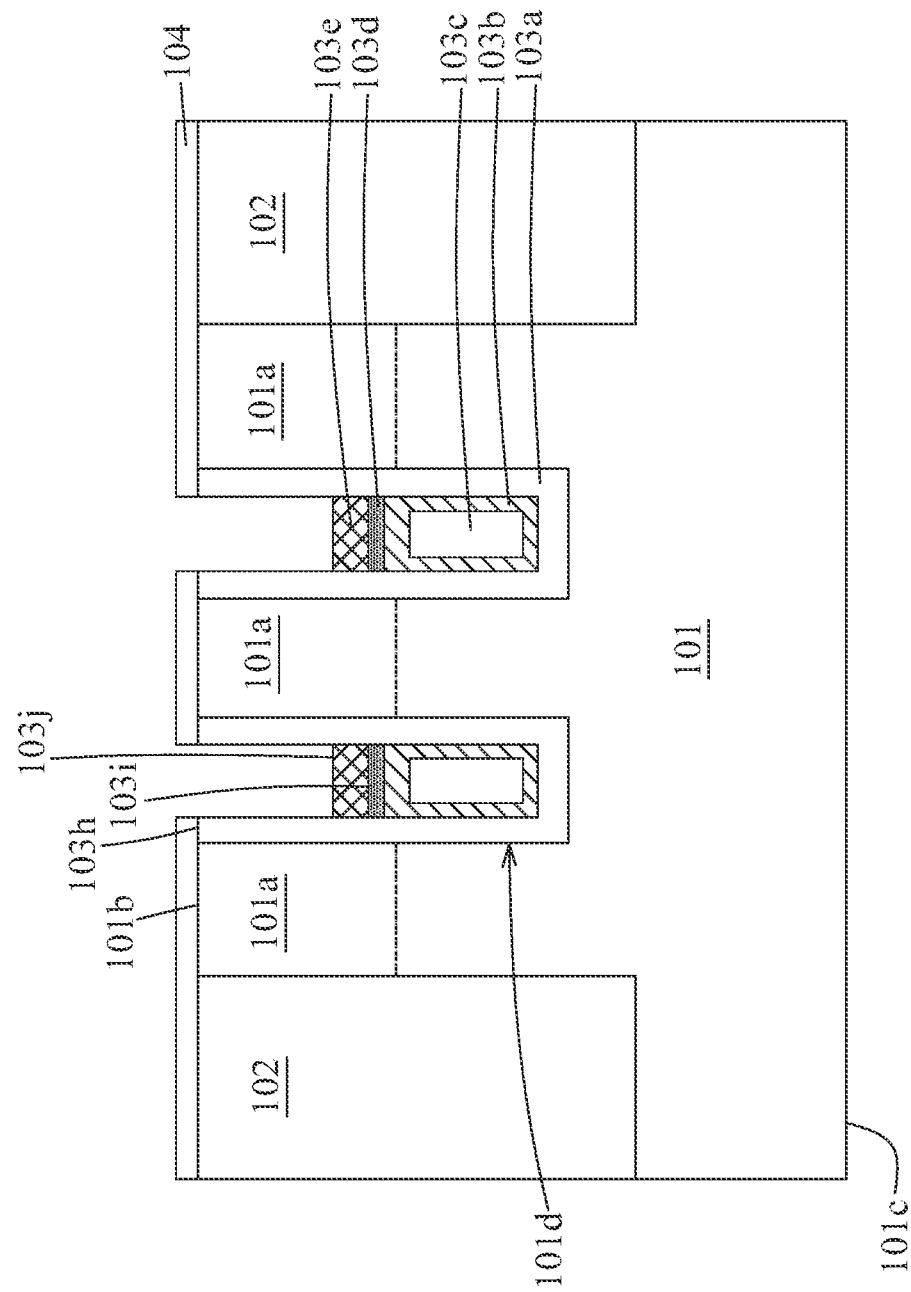
Figure 37:
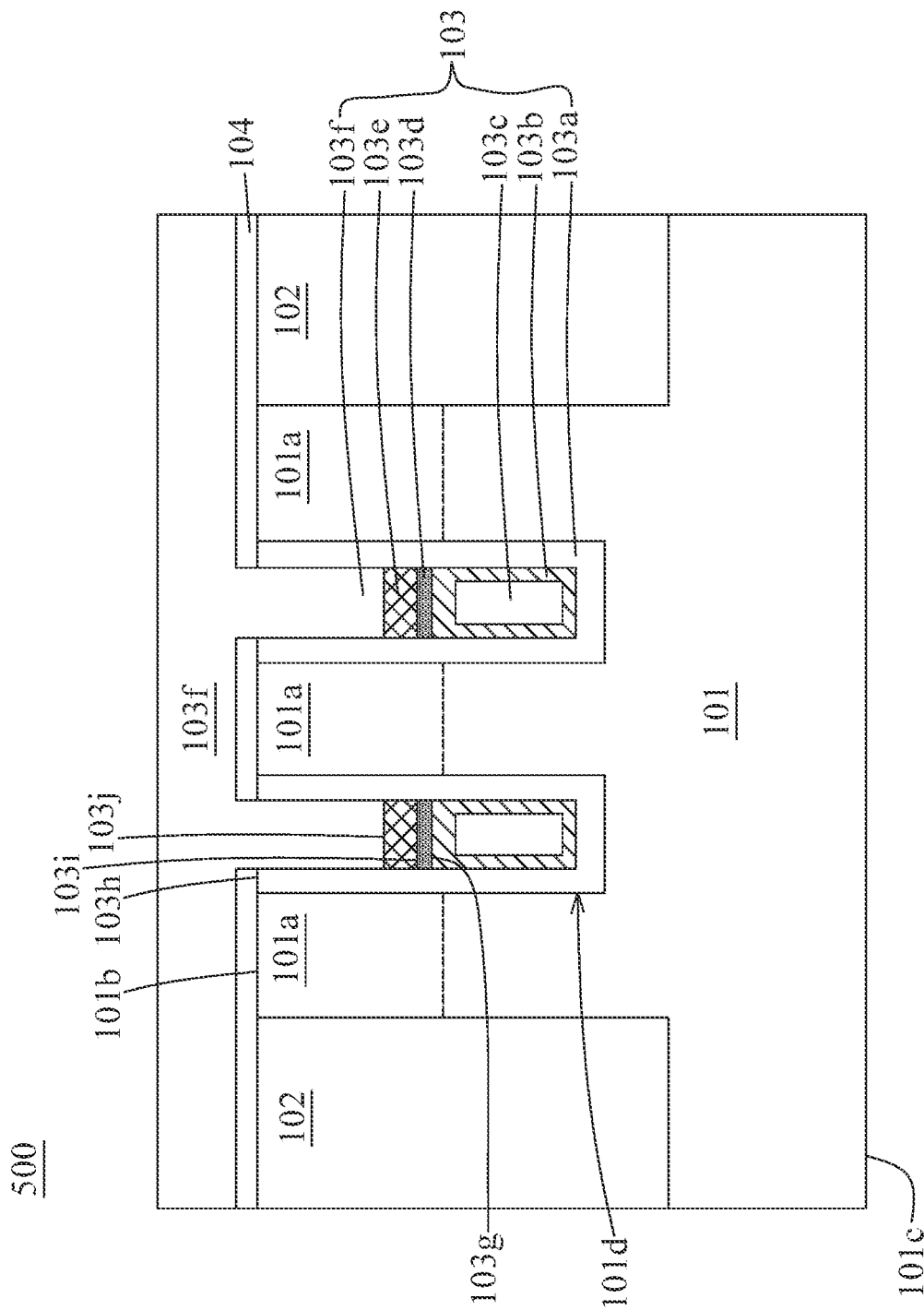

In some embodiments, after the formation of the work function member 103*e*, the mask layer 104 and the gate insulating member 103*f* are formed as shown in FIGS. 36 and 37 respectively. In some embodiments, the second insulating layer 103*d*, the mask layer 104 and the gate insulating member 103*f* are formed in a manner similar to the steps as discussed above and illustrated in FIGS. 18 and 19. In some embodiments, the memory device 500 of FIG. 5 is formed as shown in FIG. 37.

In an aspect of the present disclosure, a memory device is provided. The memory device includes a semiconductor substrate defined with an active area and including a recess extending into the semiconductor substrate; and a word line disposed within the recess, wherein the word line includes a first insulating layer disposed within and conformal to the recess, a conductive layer surrounded by the first insulating layer, a conductive member enclosed by the conductive layer, and a second insulating layer disposed over the conductive layer and conformal to the first insulating layer.

In another aspect of the present disclosure, a memory device is provided. The memory device includes a semiconductor substrate defined with an active area and including a recess extending into the semiconductor substrate; and a word line disposed within the recess, wherein the word line includes a first insulating layer disposed within and conformal to the recess, a conductive layer surrounded by the first insulating layer, a conductive member enclosed by the conductive layer, a second insulating layer disposed aver the conductive layer and conformal to the first insulating layer, a work function member surrounded by the second insulating layer, and a third insulating layer surrounded by the second insulating layer and disposed aver the work function member.

In another aspect of the present disclosure, a method of manufacturing a memory device is provided. The method includes steps of providing a semiconductor substrate defined with an active area and including an isolation structure surrounding the active area; forming a recess extending into the semiconductor substrate and across the active area; forming a first insulating layer conformal to the recess; disposing a first conductive material conformal to the first insulating layer; forming a conductive member surrounded by the first conductive material; disposing a second conductive material over the conductive member and removing a portion of the first conductive material above the second conductive material to form a conductive layer enclosing the conductive member; and forming a second insulating layer over the conductive layer and conformal to the first insulating layer.

In conclusion, because an insulating layer is disposed between a work function member and a conductive layer in a word line, an adhesion between the work function member and the conductive layer is increased or improved. Therefore, shrinkage or disappearance of the work function member after a thermal process can be prevented.

Overall performance of a memory device and process of manufacturing of the memory device are improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods and steps.

What is claimed is:

1. A method of manufacturing a memory device, comprising:
    providing a semiconductor substrate defined with an active area and including an isolation structure surrounding the active area;
    forming a recess extending into the semiconductor substrate and across the active area;
    forming a first insulating layer conformal to the recess;
    disposing a first conductive material conformal to the first insulating layer;
    forming a conductive member surrounded by the first conductive material;
    disposing a second conductive material over the conductive member and removing a portion of the first conductive material above the second conductive material to form a conductive layer enclosing the conductive member; and
    forming a second insulating layer over the conductive layer and conformal to the first insulating layer;
    wherein a top surface of the second insulating layer is substantially lower than a top surface of the first insulating layer and a top surface of the semiconductor substrate.

2. The method according to claim 1, wherein the formation of the second insulating layer is performed after the formation of the conductive layer and the formation of the conductive member.

3. The method according to claim 1, wherein the formation of the second insulating layer includes disposing an insulating material by atomic layer deposition (ALD).

4. The method according to claim 3, wherein the formation of the second insulating layer includes removing a portion of the insulating material by anisotropic etching.

5. The method according to claim 1, further comprising forming a work function member over the conductive layer, wherein the work function member is surrounded by the second insulating layer.

6. The method according to claim 5, wherein a top surface of the work function member is substantially coplanar with a top surface of the second insulating layer.

\* \* \* \* \*